United States Patent
Nakajima et al.

(10) Patent No.: US 9,760,006 B2
(45) Date of Patent: Sep. 12, 2017

(54) SILICON-CONTAINING RESIST UNDERLAYER FILM FORMING COMPOSITION HAVING UREA GROUP

(75) Inventors: Makoto Nakajima, Toyama (JP); Yuta Kanno, Toyama (JP); Wataru Shibayama, Toyama (JP)

(73) Assignee: NISSAN CHEMICAL INDUSTRIES, LTD., Tokyo (JP)

(*) Notice: Subject to any disclaimer, the term of this patent is extended or adjusted under 35 U.S.C. 154(b) by 122 days.

(21) Appl. No.: 12/811,424

(22) PCT Filed: Jan. 8, 2009

(86) PCT No.: PCT/JP2009/050143
§ 371 (c)(1),
(2), (4) Date: Jul. 1, 2010

(87) PCT Pub. No.: WO2009/088039
PCT Pub. Date: Jul. 16, 2009

(65) Prior Publication Data
US 2010/0291487 A1 Nov. 18, 2010

(30) Foreign Application Priority Data
Jan. 11, 2008 (JP) ................. 2008-004312

(51) Int. Cl.
| G03F 7/11 | (2006.01) |
| G03F 7/09 | (2006.01) |
| G03F 7/075 | (2006.01) |
| G03F 7/30 | (2006.01) |
| G03F 7/32 | (2006.01) |
| G03F 7/36 | (2006.01) |
| G03F 7/40 | (2006.01) |
| C09D 183/08 | (2006.01) |
| C08G 77/26 | (2006.01) |

(52) U.S. Cl.
CPC .............. *G03F 7/11* (2013.01); *C09D 183/08* (2013.01); *G03F 7/0752* (2013.01); *G03F 7/0757* (2013.01); *G03F 7/091* (2013.01); *G03F 7/30* (2013.01); *G03F 7/322* (2013.01); *G03F 7/36* (2013.01); *G03F 7/40* (2013.01); *C08G 77/26* (2013.01)

(58) Field of Classification Search
None
See application file for complete search history.

(56) References Cited

U.S. PATENT DOCUMENTS

| 8,329,305 B2 * | 12/2012 | Motoyama ............. C08G 77/08 427/168 |
| 2002/0190387 A1 * | 12/2002 | Raina ................. C23C 14/0057 257/765 |
| 2007/0238300 A1 | 10/2007 | Ogihara et al. |
| 2009/0050020 A1 * | 2/2009 | Konno et al. ............ 106/287.12 |
| 2010/0047539 A1 * | 2/2010 | Park et al. .................... 428/201 |

FOREIGN PATENT DOCUMENTS

| JP | 62-288849 | * 12/1987 |
| JP | 8-134355 | * 5/1996 |
| JP | A-08-333375 | 12/1996 |
| JP | A-10-209134 | 8/1998 |
| JP | A-11-258813 | 9/1999 |
| JP | A-2001-093824 | 4/2001 |
| JP | A-2004-069962 | 3/2004 |
| JP | A-2005-070776 | 3/2005 |
| JP | A-2007-302873 | 11/2007 |
| WO | WO 00/01752 A1 | 1/2000 |
| WO | WO 2005/059050 A1 * | 6/2005 |
| WO | WO 2006/093057 A1 | 9/2006 |
| WO | WO 2007/066597 A1 | 6/2007 |

OTHER PUBLICATIONS

DERWENT English abstract for JP8-134355 (1996).*
Machine-assisted English translation for JP8-134355 provided by JPO (1996).*
Machine-assisted English translation for JP2004-69962 provided by JPO (2004).*
Full English translation of JP62-288849 (Dec. 1987), as provided by USPTO.*
Google English translation of PCT/JP2009/050143 (2009).*
Schmaljohann et al., "Design Strategies for 157 nm Single-Layer Photoresists: Lithographic Evaluation of a Poly(α-trifluoromethyl vinyl alcohol) Copolymer," *Advances in Resist Technology and Processing*, vol. XVII, Proceedings of SPIE, vol. 3999, 2000, pp. 330-334.
Crawford et al., "New Materials for 157 nm Photoresists: Characterization and Properties," *Advances in Resist Technology and Processing*, vol. XVII, Proceedings of SPIE, vol. 3999, 2000, pp. 357-364.
Patterson et al., "Polymers for 157 nm Photoresist Applications: A Progress Report," *Advances in Resist Technology and Processing*, vol. XVII, Proceedings of SPIE, vol. 3999, 2000, pp. 365-374.
International Search Report in International Application No. PCT/JP2009/050143; dated Feb. 17, 2009 (with English-language translation).

* cited by examiner

*Primary Examiner* — Sin Lee
(74) *Attorney, Agent, or Firm* — Oliff PLC

(57) ABSTRACT

There is provided a resist underlayer film forming composition for lithography for forming a resist underlayer film capable of being used as a hardmask. A resist underlayer film forming composition for lithography comprising: a hydrolyzable organosilane having a urea group; a hydrolysis product thereof; or a hydrolysis-condensation product thereof. The hydrolyzable organosilane is for example a compound of Formula (1):

Formula (1)

$$T^1\underset{H}{\overset{}{\text{N}}}\!-\!\underset{\underset{T^3}{|}}{\overset{\overset{O}{\|}}{\text{C}}}\!-\!\text{N}\,T^2$$

where at least one of three groups $T^1$, $T^2$, and $T^3$ is a group of Formula (2):

Formula (2)

$$-\!(R^3)_n\!-\!\underset{\underset{(R^4)_m}{|}}{\text{Si}}(R^5)_{3-m}.$$

9 Claims, No Drawings

SILICON-CONTAINING RESIST UNDERLAYER FILM FORMING COMPOSITION HAVING UREA GROUP

TECHNICAL FIELD

The present invention relates to a composition used in the production of a semiconductor device for forming an underlayer film between a substrate and a resist (such as a photoresist and an electron beam resist). More in detail, the present invention relates to a resist underlayer film forming composition for lithography for fanning an underlayer film used as an underlayer of a photoresist in a lithography process of the production of a semiconductor device. The present invention also relates to a forming method of a resist pattern using the underlayer film forming composition.

BACKGROUND ART

Conventionally, in the production of a semiconductor device, fine processing by lithography using a photoresist has been performed. The fine processing is a processing method for forming fine convexo-concave corresponding to the pattern on the surface of a substrate by a method including: forming a thin film of a photoresist on a semiconductor substrate such as a silicon wafer; irradiating the resultant thin film with an activating light ray such as an ultraviolet ray through a mask pattern on which a pattern of a semiconductor device is depicted for development; and subjecting the substrate to etching processing using the resultant photoresist pattern as a protecting film. Recently, however, the high integration of semiconductor devices has been progressed and the adopted activating light ray tends to have a shorter wavelength, such as an ArF excimer laser (193 nm) replacing a KrF excimer laser (248 nm). Following such a tendency, the influence of reflection of an activating light ray on a semiconductor substrate has become a large problem. Thus, in order to solve this problem, widely studied is a method of providing a bottom anti-reflective coating between the photoresist and the substrate. For such a bottom anti-reflective coating, many investigations on an organic bottom anti-reflective coating composed of a polymer having a light absorbing group or the like are performed because of easiness of its use and the like. Examples of the organic bottom anti-reflective coating include: an acrylic resin-based bottom anti-reflective coating having both a hydroxyl group, which is a crosslinkable group, and a light absorbing group within the same molecule; and a novolac resin-based bottom anti-reflective coating having both a hydroxyl group, which is a crosslinkable group, and a light absorbing group within the same molecule.

Characteristics required for the bottom anti-reflective coating include: a large absorbance to light or radiation; no intermixing with a photoresist (being insoluble in a photoresist solvent); no diffusion of low molecule substances from the bottom anti-reflective coating to the photoresist at the upper layer during heating and baking; a dry etching rate larger than that of the photoresist, and the like.

Further, recently, for solving a problem of the wiring delay that has become apparent as the miniaturization of a pattern rule of the semiconductor device has progressed, the use of copper as a wiring material is studied. Then, together with it, a dual damascene process is studied as a method for forming a wiring on the semiconductor substrate. Then, in the dual damascene process, a bottom anti-reflective coating is formed on a substrate having a large aspect ratio in which a via hole is formed. Therefore, for the bottom anti-reflective coating used in this process, filling characteristics capable of filling holes without voids, planarization characteristics capable of forming a planar film on the substrate surface, and the like are required.

As an underlayer film between the semiconductor substrate and the photoresist, the use of a film known as a hardmask containing a metal element such as silicon and titanium is performed (see, for example, Patent Document 1). In this case, the resist and the hardmask have components largely different from each other, and thus, the removing speeds of the resist and the hardmask by dry-etching largely depend on the type of a gas used for dry etching. Then, by appropriately selecting the type of a gas, the hardmask can be removed by dry etching without a large decrease of the film thickness of the photoresist. Thus, in the production of semiconductor devices in recent years, for achieving various effects such as the anti-reflection effect, a resist underlayer film has become disposed between the semiconductor substrate and the photoresist. Although studies of a composition for a resist underlayer film have been performed until today, due to the diversity of characteristics required for the composition and the like, development of a novel material for the resist underlayer film is desired.

A composition or a pattern forming method using a compound having a silicon-silicon bond is known (see, for example, Patent Document 2).

A bottom anti-reflective coating forming composition containing an isocyanate group or a blocked isocyanate group is disclosed (see, for example, Patent Document 3).

A hardmask material using a resin containing a polycarbosilane is disclosed (see, for example, Patent Document 4 and Patent Document 5).

Patent Document 1: Japanese Patent Application Publication No. JP-A-11-258813
Patent Document 2: Japanese Patent Application Publication No. JP-A-10-209134
Patent Document 3: International Publication No. WO 2000/01752 pamphlet
Patent Document 4: Japanese Patent Application Publication No. JP-A-2001-93824
Patent Document 5: Japanese Patent Application Publication No. JP-A-2005-70776

DISCLOSURE OF THE INVENTION

Problem to be Solved by the Invention

It is an object of the present invention to provide a resist underlayer film forming composition for lithography capable of being used in the production of a semiconductor device. More in detail, it is an object of the present invention to provide a resist underlayer film forming composition for lithography for forming a resist underlayer film capable of being used as a hardmask. It is another object of the present invention to provide a resist underlayer film forming composition for lithography for forming a resist underlayer film capable of being used as a bottom anti-reflective coating. Further, it is another object of the present invention to provide a resist underlayer film for lithography causing no intermixing with a resist and having a dry etching rate larger than that of a resist, and a resist underlayer film forming composition for forming the underlayer film.

It is another object of the present invention to provide a resist pattern forming method using the resist underlayer film forming composition for lithography.

Means for Solving the Problem

The present invention provides: according to a first aspect, a resist underlayer film forming composition for lithography containing a hydrolyzable organosilane having a urea group, a hydrolysis product thereof, or a hydrolysis-condensation product thereof;

according to a second aspect, in the resist underlayer film forming composition according to the first aspect, the hydrolyzable organosilane is a compound of Formula (1):

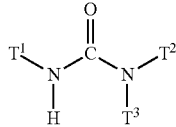

Formula (1)

[where at least one of three groups $T^1$, $T^2$, and $T^3$ is a group of Formula (2):

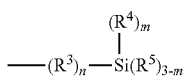

Formula (2)

(where
$R^3$ is an alkylene group, an arylene group, a halogenated alkylene group, a halogenated arylene group, an alkenylene group, or a divalent linking group derived from an organic group having an epoxy group, an acryloyl group, a methacryloyl group, a mercapto group, an amino group, or a cyano group,
n is an integer of 0 or 1,
$R^4$ is an alkyl group, an aryl group, a halogenated alkyl group, a halogenated aryl group, an alkenyl group, or an organic group having an epoxy group, an acryloyl group, a methacryloyl group, a mercapto group, an amino group, or a cyano group,
$R^5$ is an alkoxy group, an acyloxy group, or a halogen atom, and
m is an integer of 0 or 1),
the other(s) of the three groups $T^1$, $T^2$, and $T^3$ is (are) independently a hydrogen atom, $R^1$, or
$R^2$ (where $R^1$ and $R^2$ are independently an alkyl group, an aryl group, a halogenated alkyl group, a halogenated aryl group, an alkenyl group, or an organic group having an epoxy group, an acryloyl group, a methacryloyl group, a mercapto group, an amino group, or a cyano group, where $R^1$ and $R^2$ together may form a ring)];

according to a third aspect, in the resist underlayer film forming composition according to the first aspect or the second aspect, the hydrolyzable organosilane of Formula (1) is a compound obtained by reacting an isocyanate compound of Formula (3):

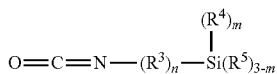

Formula (3)

(where $R^3$, $R^4$, $R^5$, n, and m are the same as those defined in Formula (2)) with ammonia, a primary amine, or a secondary amine;

according to a fourth aspect, in the resist underlayer film forming composition according to the first aspect or the second aspect, the hydrolyzable organosilane of Formula (1) is a compound obtained by reacting a hydrolyzable organosilane containing an amino group or an imino group with an isocyanate compound;

according to a fifth aspect, the resist underlayer film forming composition according to any one of the first aspect to the fourth aspect, containing a combination of: at least one type of organic silicon compound selected from a group consisting of an organic silicon compound of Formula (4):

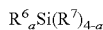 Formula (4)

(where
$R^6$ is an alkyl group, an aryl group, a halogenated alkyl group, a halogenated aryl group, an alkenyl group, or an organic group having an epoxy group, an acryloyl group, a methacryloyl group, a mercapto group, an amino group, or a cyano group, and is bonded to a silicon atom through a Si—C bond,
$R^7$ is an alkoxy group, an acyloxy group, or a halogen atom, and
a is an integer of 0 to 3) and an organic silicon compound of Formula (5):

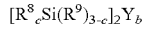 Formula (5)

(where
$R^8$ is an alkyl group,
$R^9$ is an alkoxy group, an acyloxy group, or a halogen atom,
Y is an alkylene group or an arylene group,
b is an integer of 0 or 1, and
c is an integer of 0 or 1); and the hydrolyzable organosilane of Formula (1) as described in any one of the first aspect to the fourth aspect; a hydrolysis product thereof; or a hydrolysis-condensation product thereof;

according to a sixth aspect, a resist underlayer film forming composition for lithography containing a polymer of a hydrolysis-condensation product of the hydrolysable organosilane of Formula (1) as described in any one of the first aspect to the fourth aspect; or a polymer of a hydrolysis-condensation product of the hydrolyzable organosilane of Formula (1) and a polymer of a hydrolysis-condensation product of the organic silicon compound of Formula (4);

according to a seventh aspect, the resist underlayer film forming composition according to any one of the first aspect to the sixth aspect, further containing a curing catalyst;

according to an eighth aspect, a resist underlayer film obtained by applying the resist underlayer film forming composition as described in any one of the first aspect to the seventh aspect on a semiconductor substrate and baking the composition;

according to a ninth aspect, a production method of a semiconductor device including: applying the resist underlayer film forming composition as described in any one of the first aspect to the seventh aspect on a semiconductor substrate and baking the composition to form a resist underlayer film; applying a composition for a resist on the resist underlayer film to form a resist film; exposing the resist film to light; developing the resist after the exposure to produce a resist pattern; etching the resist underlayer film through the resist pattern; and processing the semiconductor substrate using the patterned resist and the patterned resist underlayer film; and according to a tenth aspect, a production method of a semiconductor device including: forming an organic film on a semiconductor substrate; applying the resist underlayer film forming composition as described in any one of the first aspect to the seventh aspect on the organic film and baking the composition to form a resist underlayer film; applying a composition for a resist on the resist underlayer film to form a resist film; exposing the resist film to light; developing the resist after the exposure to produce a resist pattern; etching the resist underlayer film through the resist pattern; etching the organic underlayer film using the patterned resist underlayer film; and processing the semiconductor substrate using the patterned organic underlayer film.

Effects of the Invention

In the present invention, the resist underlayer film is fowled by an applying method either on a substrate or on an organic underlayer film formed on a substrate and, on the resist underlayer film, a resist film (such as a photoresist and an electron beam resist) is formed. Then, a resist pattern is formed by exposure and development, and either by dry etching the resist underlayer film using the resist pattern to transfer the pattern, the substrate is processed by the transferred pattern, or by etching the organic underlayer film to transfer the pattern, the substrate is processed by the etched organic underlayer film.

In forming a fine pattern, for preventing a pattern collapse, the resist film thickness tends to become smaller. Due to the thinning of the resist, the dry etching for transferring the pattern to a film existing as an underlayer of the resist cannot transfer the pattern unless the etching rate of the underlayer film is higher than that of the upper layer film. In the present invention, the substrate is coated with the resist underlayer film (containing an inorganic silicon-based compound) of the present specification either with or without an organic underlayer film interposed therebetween, and then the resist underlayer film is coated with a resist film (an organic resist film). An organic component film and an inorganic component film have dry etching rates largely different from each other depending on the selection of the etching gas such that the dry etching rate of the organic component film is enhanced by an oxygen-based gas and the dry etching rate of the inorganic component film is enhanced by a halogen-containing gas.

For example, there is formed a resist pattern which is transferred to the resist underlayer film of the present specification existing as an underlayer of the resist pattern by dry etching the resist underlayer film with a halogen-containing gas, and the substrate is processed with a halogen-containing gas according to the pattern transferred to the resist underlayer film. Alternatively, by dry etching the organic underlayer film existing as an underlayer of the resist underlayer film with an oxygen-based gas using the resist underlayer film to which the pattern is transferred, the pattern is transferred to the organic underlayer film, and the substrate is processed with a halogen-containing gas using the organic underlayer film to which the pattern is transferred.

In the present invention, the resist underlayer film functions as a hardmask and a hydrolyzable group in the structure of Formula (1) such as an alkoxy group and an acyloxy group is hydrolyzed or partially hydrolyzed and, thereafter, forms a polyorganosiloxane structure by a condensation reaction of a silanol group. This polyorganosiloxane structure has a satisfactory function as a hardmask.

The hydrolyzable organosilane compound of Formula (1) having a urea group used in the present invention forms a polyorganosiloxane by hydrolysis and a subsequent condensation reaction. It is considered that a resist underlayer film forming composition containing a polyorganosiloxane having a urea group is applied on a substrate to form a film of a polyorganosiloxane having a urea group and this film is subjected to deammoniation or deamination by the heating, so that a part of the polyorganosiloxane is converted into a corresponding isocyanate group and a part of the polyorganosiloxane forms a continuous urea bond between the adjacent urea groups. It is also considered that ammonia or an amine generated by the deammoniation or the deamination also acts as a catalyst for accelerating the formation of a polysiloxane by condensing silanol groups generated by the hydrolysis of a hydrolyzable group of a hydrolyzable silane.

The isocyanate group can crosslink a polyorganosiloxane structure by the use of a catalyst such as a trialkylphosphine, which effects a cyclization reaction among three molecules of the isocyanate group to form a triazinetrione ring. It is also considered that two molecules of the isocyanate group react with each other to form a crosslinkage bond such as a urea structure, a biuret structure, a urethane structure, and an allophanate structure to crosslink the polyorganosiloxane.

It is also considered that a hydrogen atom of a primary amine or a secondary amine on the urea group is coordinate-bonded with a nitrogen atom of an amine on an adjacent urea group to cause deammoniation or deamination and, then, a continuous urea bond is generated to crosslink the polyorganosiloxane.

The bonding moiety contained in the polyorganosiloxane has a carbon-nitrogen bond or a carbon-oxygen bond that have a dry etching rate by a halogen-based gas higher than that of a carbon-carbon bond, so that the bonding moiety is effective for transferring an upper layer resist pattern to the resist underlayer film.

Then, the polyorganosiloxane structure (an intermediate film) is effective as a hardmask for etching an organic underlayer film existing under the intermediate film or for processing (etching) the substrate. In other words, the polyorganosiloxane structure has satisfactory dry etching resistance during the substrate processing or relative to an oxygen-based dry etching gas for the organic underlayer The resist underlayer film of the present invention possesses an enhanced dry etching rate relative to the upper layer resist and dry etching resistance during the substrate processing or the like.

BEST MODES FOR CARRYING OUT THE INVENTION

The resist underlayer film forming composition for lithography of the present invention contains a hydrolyzable organosilane containing a urea group, a hydrolysis product thereof, or a hydrolysis-condensation product thereof. These hydrolyzable silane, hydrolysis product thereof, and hydrolysis-condensation product thereof can also be used in combination. The hydrolyzable silane is hydrolyzed and the obtained hydrolysis product can be condensed to be used as a condensation product. A partial hydrolysis product as a result of an incomplete hydrolysis when obtaining a hydrolysis-condensation product or a mixture of a hydrolysis-condensation product with a silane compound can also be used. The condensation product has a polysiloxane structure. To this polysiloxane, a urea group or an organic group containing a urea group is bonded.

The resist underlayer film forming composition of the present invention contains a hydrolyzable organosilane containing a urea group, a hydrolysis product thereof, or a hydrolysis-condensation product thereof and a solvent, and the composition preferably contains particularly a hydrolysis-condensation product of the hydrolyzable organosilane containing a urea group and a solvent. In addition, the composition of the present invention may contain, as optional components, an acid, water, an alcohol, a curing catalyst, an acid generator, other organic polymers, a light-absorptive compound, a surfactant, and the like.

The solid content of the resist underlayer film forming composition of the present invention is, for example, 0.5 to 50% by mass, 1 to 30% by mass, or 1 to 25% by mass. Here, the solid content is a component remaining after subtracting a solvent component from the whole component of the resist underlayer film forming composition.

The ratio constituted by the hydrolyzable organosilane, a hydrolysis product thereof, and a hydrolysis-condensation product thereof in the solid content is 20% by mass or more, for example 50 to 100% by mass, 60 to 100% by mass, or 70 to 100% by mass.

The hydrolyzable organosilane used in the present invention has a structure of Formula (1).

In Formula (1), at least one of the three groups $T^1$, $T^2$, and $T^3$ has (have) a structure of Formula (2).

In Formula (2), $R^3$ is an alkylene group, an arylene group, a halogenated alkylene group, a halogenated arylene group, an alkenylene group, or a divalent linking group derived from an organic group having an epoxy group, an acryloyl group, a methacryloyl group, a mercapto group, an amino group, or a cyano group; n is an integer of 0 or 1; $R^4$ is an alkyl group, an aryl group, a halogenated alkyl group, a halogenated aryl group, an alkenyl group, or an organic group having an epoxy group, an acryloyl group, a methacryloyl group, a mercapto group, an amino group, or a cyano group; $R^5$ is an alkoxy group, an acyloxy group, or a halogen atom; and m is an integer of 0 or 1.

The other $T^1$, $T^2$, and $T^3$ is (are) independently a hydrogen atom, $R^1$, or $R^2$. $R^1$ and $R^2$ are independently an alkyl group, an aryl group, a halogenated alkyl group, a halogenated aryl group, an alkenyl group, or an organic group having an epoxy group, an acryloyl group, a methacryloyl group, a mercapto group, an amino group, or a cyano group, where $R^1$ and $R^2$ together may form a ring.

Examples of the alkylene group include $C_{1-10}$ alkylene groups such as a methylene group, an ethylene group, a propylene group, an isopropylene group, a butylene group, and an octylene group. A divalent organic group derived from the chain or branched alkyl groups exemplified below can be used as the alkylene group.

Examples of the alkylene group also include $C_{3-20}$ cycloalkylene groups such as a cyclopropylene group, a cyclobutylene group, and a cyclohexene group. A divalent organic group derived from the cycloalkyl groups exemplified below can be used as the alkylene group.

Examples of the arylene group include $C_{6-20}$ arylene groups such as a phenylene group, a naphthylene group, and an anthralene group. A divalent organic group derived from the aryl groups exemplified below can be used as the arylene group.

As the alkenylene group, a divalent organic group derived from the alkenyl groups exemplified below can be used as the alkenylene group.

In Formula (1) and Formula (2), the alkyl group is a linear or branched $C_{1-10}$ alkyl group and examples of the alkyl group include a methyl group, an ethyl group, an n-propyl group, an isopropyl group, an n-butyl group, an isobutyl group, a sec-butyl group, a text-butyl group, an n-pentyl group, a 1-methyl-n-butyl group, a 2-methyl-n-butyl group, a 3-methyl-n-butyl group, a 1,1-dimethyl-n-propyl group, a 1,2-dimethyl-n-propyl group, a 2,2-dimethyl-n-propyl group, a 1-ethyl-n-propyl group, an n-hexyl group, a 1-methyl-n-pentyl group, a 2-methyl-n-pentyl group, a 3-methyl-n-pentyl group, a 4-methyl-n-pentyl group, a 1,1-dimethyl-n-butyl group, a 1,2-dimethyl-n-butyl group, a 1,3-dimethyl-n-butyl group, a 2,2-dimethyl-n-butyl group, a 2,3-dimethyl-n-butyl group, a 3,3-dimethyl-n-butyl group, a 1-ethyl-n-butyl group, a 2-ethyl-n-butyl group, a 1,1,2-trimethyl-n-propyl group, a 1,2,2-trimethyl-n-propyl group, a 1-ethyl-1-methyl-n-propyl group, and a 1-ethyl-2-methyl-n-propyl group.

Also, a cyclic alkyl group can be used and examples of the cyclic alkyl group include $C_{1-10}$ cyclic alkyl groups such as a cyclopropyl group, a cyclobutyl group, a 1-methyl-cyclopropyl group, a 2-methyl-cyclopropyl group, a cyclopentyl group, a 1-methyl-cyclobutyl group, a 2-methyl-cyclobutyl group, a 3-methyl-cyclobutyl group, a 1,2-dimethyl-cyclopropyl group, a 2,3-dimethyl-cyclopropyl group, a 1-ethyl-cyclopropyl group, a 2-ethyl-cyclopropyl group, a cyclohexyl group, a 1-methyl-cyclopentyl group, a 2-methyl-cyclopentyl group, a 3-methyl-cyclopentyl group, a 1-ethyl-cyclobutyl group, a 2-ethyl-cyclobutyl group, a 3-ethyl-cyclobutyl group, a 1,2-dimethyl-cyclobutyl group, a 1,3-dimethyl-cyclobutyl group, a 2,2-dimethyl-cyclobutyl group, a 2,3-dimethyl-cyclobutyl group, a 2,4-dimethyl-cyclobutyl group, a 3,3-dimethyl-cyclobutyl group, a 1-n-propyl-cyclopropyl group, a 2-n-propyl-cyclopropyl group, a 1-isopropyl-cyclopropyl group, a 2-isopropyl-cyclopropyl group, a 1,2,2-trimethyl-cyclopropyl group, a 1,2,3-trimethyl-cyclopropyl group, a 2,2,3-trimethyl-cyclopropyl group, a 1-ethyl-2-methyl-cyclopropyl group, a 2-ethyl-1-methyl-cyclopropyl group, a 2-ethyl-2-methyl-cyclopropyl group, and a 2-ethyl-3-methyl-cyclopropyl group.

Examples of the aryl group include $C_{6-20}$ aryl groups such as a phenyl group, an o-methylphenyl group, an m-methylphenyl group, a p-methylphenyl group, an o-chlorophenyl group, an m-chlorophenyl group, a p-chlorophenyl group, an o-fluorophenyl group, a p-mercaptophenyl group, an o-methoxyphenyl group, a p-methoxyphenyl group, a p-aminophenyl group, a p-cyanophenyl group, an α-naphthyl group, a β-naphthyl group, an o-biphenylyl group, an m-biphenylyl group, a p-biphenylyl group, a 1-anthryl group, a 2-anthryl group, a 9-anthryl group, a 1-phenanthryl group, a 2-phenanthryl group, a 3-phenanthryl group, a 4-phenanthryl group, and a 9-phenanthryl group.

Examples of the alkenyl group include $C_{2-10}$ alkenyl groups such as an ethenyl group, a 1-propenyl group, a 2-propenyl group, a 1-methyl-1-ethenyl group, a 1-butenyl group, a 2-butenyl group, a 3-butenyl group, a 2-methyl-1-propenyl group, a 2-methyl-2-propenyl group, a 1-ethyl ethenyl group, a 1-methyl-l-propenyl group, a 1-methyl-2-propenyl group, a 1-pentenyl group, a 2-pentenyl group, a 3-pentenyl group, a 4-pentenyl group, a 1-n-propyl ethenyl group, a 1-methyl-l-butenyl group, a 1-methyl-2-butenyl group, a 1-methyl-3-butenyl group, a 2-ethyl-2-propenyl group, a 2-methyl-1-butenyl group, a 2-methyl-2-butenyl group, a 2-methyl-3-butenyl group, a 3-methyl-1-butenyl group, a 3-methyl-2-butenyl group, a 3-methyl-3-butenyl group, a 1,1-dimethyl-2-propenyl group, a 1-isopropyl ethenyl group, a 1,2-dimethyl-1-propenyl group, a 1,2-dimethyl-2-propenyl group, a 1-cyclopentenyl group, a 2-cyclopentenyl group, a 3-cyclopentenyl group, a 1-hexenyl group, a 2-hexenyl group, a 3-hexenyl group, a 4-hexenyl group, a 5-hexenyl group, a 1-methyl-1-pentenyl group, a 1-methyl-2-pentenyl group, a 1-methyl-3-pentenyl group, a 1-methyl-4-pentenyl group, a 1-n-butyl ethenyl group, a 2-methyl-l-pentenyl group, a 2-methyl-2-pentenyl group, a 2-methyl-3-pentenyl group, a 2-methyl-4-pentenyl group, a 2-n-propyl-2-propenyl group, a 3-methyl-1-pentenyl group, a 3-methyl-2-pentenyl group, a 3-methyl-3-pentenyl group, a 3-methyl-4-pentenyl group, a 3-ethyl-3-butenyl group, a 4-methyl-1-pentenyl group, a 4-methyl-2-pentenyl group, a 4-methyl-3-pentenyl group, a 4-methyl-4-pentenyl group, a 1,1-dimethyl-2-butenyl group, a 1,1-dimethyl-3-butenyl group, a 1,2-dimethyl-1-butenyl group, a 1,2-dimethyl-2-butenyl group, a 1,2-dimethyl-3-butenyl group, a 1-methyl-2-ethyl-2-propenyl group, a 1-sec-butyl ethenyl group, a 1,3-dimethyl-1-butenyl group, a 1,3-dimethyl-2-butenyl group, a 1,3-dimethyl-3-butenyl group, a 1-isobutyl ethenyl group, a 2,2-dimethyl-3-butenyl group, a 2,3-dimethyl-1-butenyl group, a 2,3-dimethyl-2-butenyl group, a 2,3-dimethyl-3-butenyl group, a 2-isopropyl-2-propenyl group, a 3,3-dimethyl-1-butenyl group, a 1-ethyl-1-butenyl group, a 1-ethyl-2-butenyl group, a 1-ethyl-3-butenyl group, a 1-n-propyl-1-propenyl group, a 1-n-propyl-2-propenyl group, a 2-ethyl-1-butenyl group, a 2-ethyl-2-butenyl group, a 2-ethyl-3-butenyl group, a 1,1,2-trimethyl-2-propenyl group, a 1-tert-butyl ethenyl group, a 1-methyl-1-ethyl-2-propenyl group, a 1-ethyl-2-methyl-1-propenyl group, a 1-ethyl-2-methyl-2-propenyl group, a 1-isopropyl-1-propenyl group, a 1-isopropyl-2-propenyl group, a 1-methyl-2-cyclopentenyl group, a 1-methyl-3-cyclopentenyl group, a 2-methyl-1-cyclopentenyl group, a 2-methyl-2-cyclopentenyl group, a 2-methyl-3-cyclopentenyl group, a 2-methyl-4-cyclopentenyl group, a 2-methyl-5-cyclopentenyl group, a 2-methylene-cyclopentyl group, a 3-methyl-1-cyclopentenyl group, a 3-methyl-2-cyclopentenyl group, a 3-methyl-3-cyclopentenyl group, a 3-methyl-4-cyclopentenyl group, a 3-methyl-5-cyclopentenyl group, a 3-methylene-cyclopentyl group, a 1-cyclohexenyl group, a 2-cyclohexenyl group, and a 3-cyclohexenyl group.

Examples of the alkenyl group also include organic groups in which the above groups are substituted with a halogen atom such as a fluorine atom, a chlorine atom, a bromine atom, and an iodine atom.

Examples of the organic group having an epoxy group include a glycidoxymethyl group, a glycidoxyethyl group, a glycidoxypropyl group, a glycidoxybutyl group, and an epoxycyclohexyl group.

Examples of the organic group having an acryloyl group include an acryloylmethyl group, an acryloylethyl group, and an acryloylpropyl group.

Examples of the organic group having a methacryloyl group include a methacryloylmethyl group, a methacryloylethyl group, and a methacryloylpropyl group.

Examples of the organic group having a mercapto group include an ethylmercapto group, a butylmercapto group, a hexylmercapto group, and an octylmercapto group.

Examples of the organic group having an amino group include an aminoethyl group and an aminopropyl group.

Examples of the organic group having a cyano group include a cyanoethyl group and a cyanopropyl group.

Examples of the $C_{1-20}$ alkoxy group as $R^5$ in Formula (2) include $C_{1-20}$ alkoxy groups having a linear, branched, or cyclic alkyl portion, such as a methoxy group, an ethoxy group, an n-propoxy group, an isopropoxy group, an n-butoxy group, an isobutoxy group, a sec-butoxy group, a tert-butoxy group, an n-pentyloxy group, a 1-methyl-n-butoxy group, a 2-methyl-n-butoxy group, a 3-methyl-n-butoxy group, a 1,1-dimethyl-n-propoxy group, a 1,2-dimethyl-n-propoxy group, a 2,2-dimethyl-n-propoxy group, a 1-ethyl-n-propoxy group, an n-hexyloxy group, a 1-methyl-n-pentyloxy group, a 2-methyl-n-pentyloxy group, a 3-methyl-n-pentyloxy group, a 4-methyl-n-pentyloxy group, a 1,1-dimethyl-n-butoxy group, a 1,2-dimethyl-n-butoxy group, a 1,3-dimethyl-n-butoxy group, a 2,2-dimethyl-n-butoxy group, a 2,3-dimethyl-n-butoxy group, a 3,3-dimethyl-n-butoxy group, a 1-ethyl-n-butoxy group, a 2-ethyl-n-butoxy group, a 1,1,2-trimethyl-n-propoxy group, a 1,2,2-trimethyl-n-propoxy group, a 1-ethyl-1-methyl-n-propoxy group, and a 1-ethyl-2-methyl-n-propoxy group. Examples of the cyclic alkoxy group as $R^5$ include a cyclopropoxy group, a cyclobutoxy group, a 1-methyl-cyclopropoxy group, a 2-methyl-cyclopropoxy group, a cyclopentyloxy group, a 1-methyl-cyclobutoxy group, a 2-methyl-cyclobutoxy group, a 3-methyl-cyclobutoxy group, a 1,2-dimethyl-cyclopropoxy group, a 2,3-dimethyl-cyclopropoxy group, a 1-ethyl-cyclopropoxy group, a 2-ethyl-cyclopropoxy group, a cyclohexyloxy group, a 1-methyl-cyclopentyloxy group, a 2-methyl-cyclopentyloxy group, a 3-methyl-cyclopentyloxy group, a 1-ethyl-cyclobutoxy group, a 2-ethyl-cyclobutoxy group, a 3-ethyl-cyclobutoxy group, a 1,2-dimethyl-cyclobutoxy group, a 1,3-dimethyl-cyclobutoxy group, a 2,2-dimethyl-cyclobutoxy group, a 2,3-dimethyl-cyclobutoxy group, a 2,4-dimethyl-cyclobutoxy group, a 3,3-dimethyl-cyclobutoxy group, a 1-n-propyl-cyclopropoxy group, a 2-n-propyl-cyclopropoxy group, a 1-isopropyl-cyclopropoxy group, a 2-isopropyl-cyclopropoxy group, a 1,2,2-trimethyl-cyclopropoxy group, a 1,2,3-trimethyl-cyclopropoxy group, a 2,2,3-trimethyl-cyclopropoxy group, a 1-ethyl-2-methyl-cyclopropoxy group, a 2-ethyl-1-methyl-cyclopropoxy group, a 2-ethyl-2-methyl-cyclopropoxy group, and a 2-ethyl-3-methyl-cyclopropoxy group.

Examples of the $C_{1-20}$ acyloxy group as $R^5$ in Formula (2) include a methylcarbonyloxy group, an ethylcarbonyloxy group, an n-propylcarbonyloxy group, an isopropylcarbonyloxy group, an n-butylcarbonyloxy group, an isobutylcarbonyloxy group, a sec-butylcarbonyloxy group, a tert-butylcarbonyloxy group, an n-pentylcarbonyloxy group, a 1-methyl-n-butylcarbonyloxy group, a 2-methyl-n-butylcarbonyloxy group, a 3-methyl-n-butylcarbonyloxy group, a 1,1-dimethyl-n-propylcarbonyloxy group, a 1,2-dimethyl-n-propylcarbonyloxy group, a 2,2-dimethyl-n-propylcarbonyloxy group, a 1-ethyl-n-propylcarbonyloxy group, an n-hexylcarbonyloxy group, a 1-methyl-n-pentylcarbonyloxy group, a 2-methyl-n-pentylcarbonyloxy group, a 3-methyl-n-pentylcarbonyloxy group, a 4-methyl-n-pentylcarbonyloxy group, a 1,1-dimethyl-n-butylcarbonyloxy group, a 1,2-dimethyl-n-butylcarbonyloxy group, a 1,3-dimethyl-n-butylcarbonyloxy group, a 2,2-dimethyl-n-butylcarbonyloxy group, a 2,3-dimethyl-n-butylcarbonyloxy group, a 3,3-dimethyl-n-butylcarbonyloxy group, a 1-ethyl-n-butylcarbonyloxy group, a 2-ethyl-n-butylcarbonyloxy group, a 1,1,2-trimethyl-n-propylcarbonyloxy group, a 1,2,2-trimethyl-n-propylcarbonyloxy group, a 1-ethyl-1-methyl-n-propylcarbonyloxy group, a 1-ethyl-2-methyl-n-propylcarbonyloxy group, a phenylcarbonyloxy group, and a tosylcarbonyloxy group.

Examples of the halogen atom as $R^5$ in Formula (2) include a fluorine atom, a chlorine atom, a bromine atom, and an iodine atom.

As the hydrolyzable organosilane of Formula (1), commercial products may be used. The hydrolyzable organosilane of Formula (1) can be obtained by reacting an isocyanate compound of Formula (3) with ammonia, a primary amine, or a secondary amine.

The reaction between the isocyanate compound and ammonia, a primary amine, or a secondary amine can be effected at 0 to 100° C. for 1 to 4 hour(s). Examples of the solvent used in the reaction include tetrahydrofuran, acetone, and toluene.

Examples of the isocyanate compound of Formula (3) include the following.

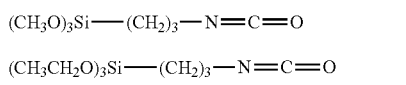 Formula (I-1)
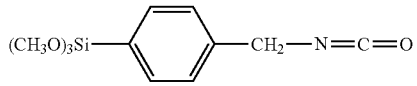 Formula (I-2)
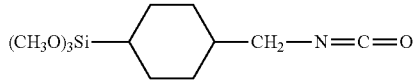 Formula (I-3)
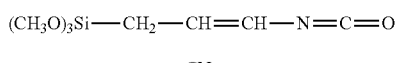 Formula (I-4)
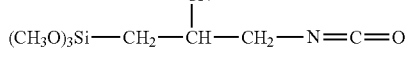 Formula (I-5)
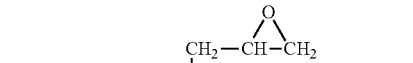 Formula (I-6)
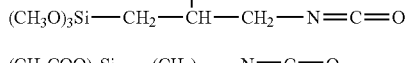 Formula (I-7)
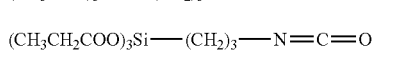 Formula (I-8)
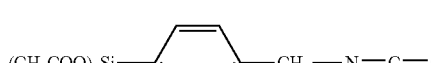 Formula (I-9)
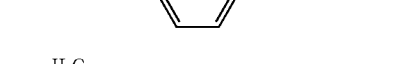 Formula (I-10)
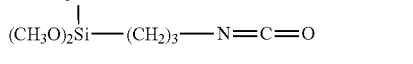 Formula (I-11)
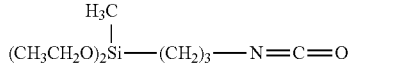 Formula (I-12)
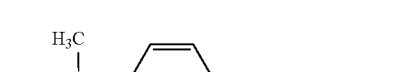 Formula (I-13)
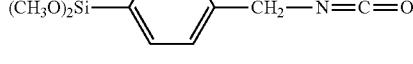 Formula (I-14)
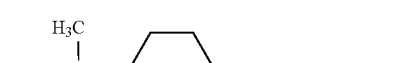 Formula (I-15)
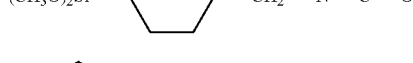 Formula (I-16)
 Formula (I-17)
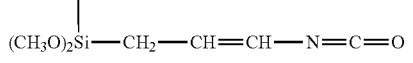 Formula (I-18)

-continued

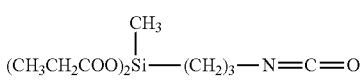 Formula (I-19)
 Formula (I-20)
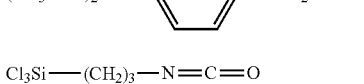 Formula (I-21)
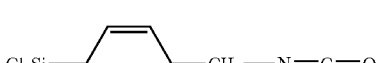 Formula (I-22)
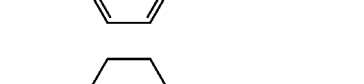 Formula (I-23)
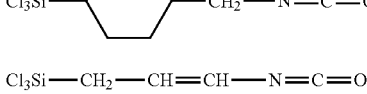 Formula (I-24)
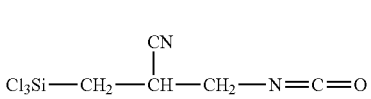 Formula (I-25)
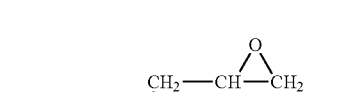 Formula (I-26)

Examples of the primary amine and the secondary amine include $C_{1-20}$ aromatic and aliphatic primary and secondary amines, such as methylamine, dimethylamine, ethylamine, diethylamine, propylamine, dipropylamine, isopropylamine, diisopropylamine, benzyl-tert-butylamine, tert-butylamine, di-tert-butylamine, phenylamine, diphenylamine, benzylamine, phenylethylamine, di(phenylethyl)amine, benzofuranamine, quinolineamine, ethylenediamine, benzenetetraamine, dichlorodiethylamine, chloroethylpropylamine, aziridine, and aniline.

In addition, amines of (II-1) to (II-38) below can also be used.

 Formula (II-1)

 Formula (II-2)

 Formula (II-3)

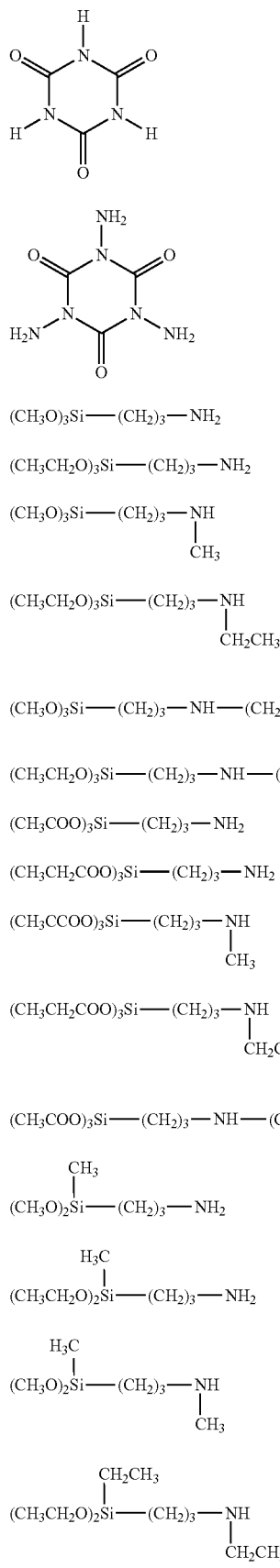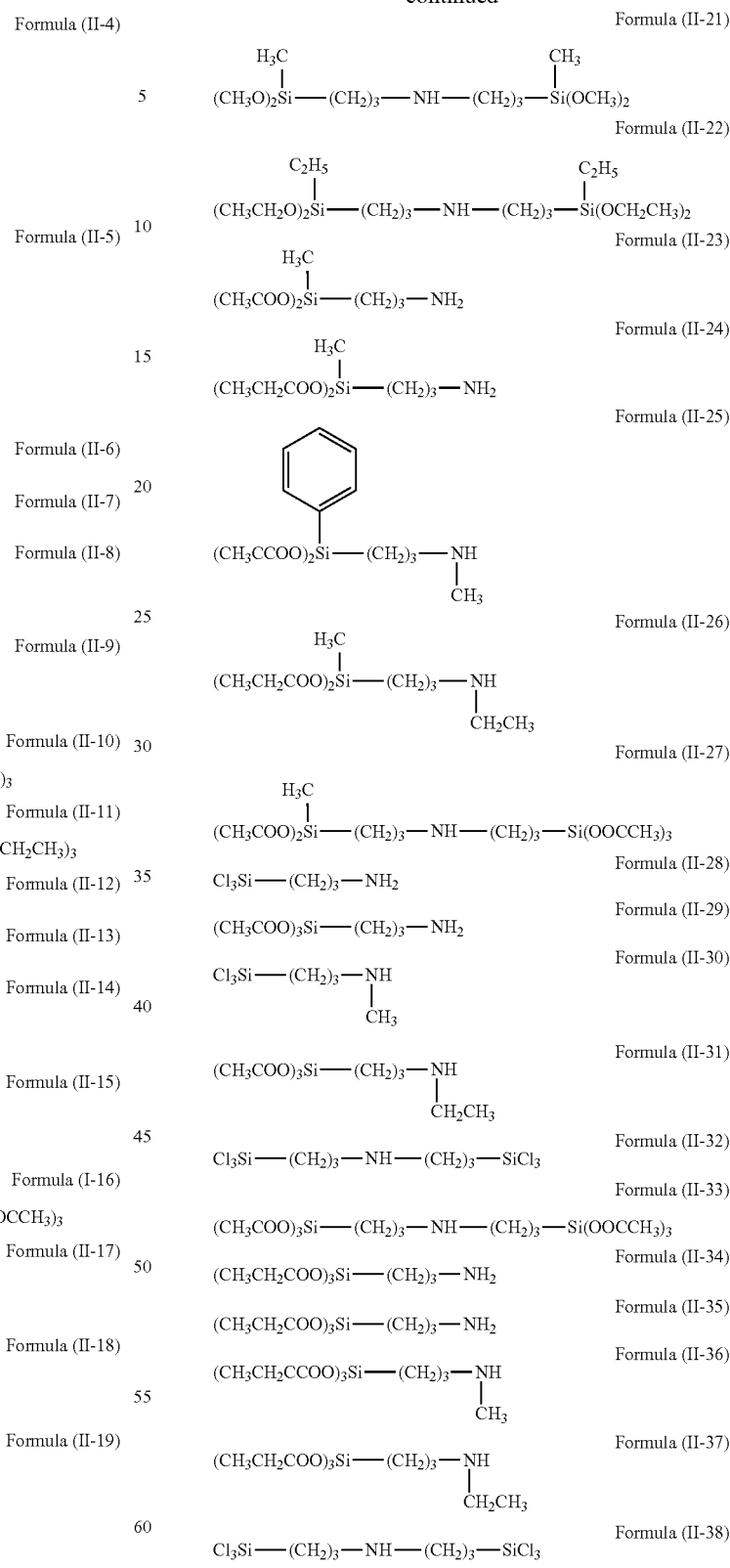
The hydrolyzable organosilane of Formula (1) can also be obtained by reacting a hydrolyzable organosilane having an amino group or an imino group with an isocyanate compound.

The reaction between the hydrolyzable organosilane having an amino group or an imino group and the isocyanate compound can be effected at 0 to 100° C. for 1 to 4 hour(s). Examples of the solvent used for this reaction include tetrahydrofuran, acetone, and toluene.

Examples of the hydrolyzable organosilane having an amino group or an imino group include (II-6) to (II-27) above.

Examples of the isocyanate compound include: monoisocyanates such as methyl isocyanate, ethyl isocyanate, propyl isocyanate, isopropyl isocyanate, butyl isocyanate, phenyl isocyanate, tolyl isocyanate, naphthalene isocyanate, and anthracene isocyanate; diisocyanates such as tolylene diisocyanate, diphenylmethane diisocyanate, tetrarnethylxylylene diisocyanate, hydrogenated diphenylmethane diisocyanate, norbornene diisocyanate, xylylene diisocyanate, isophorone diisocyanate, and hexamethylene diisocyanate; and triisocyanate compounds such as lysine ester triisocyanate, 1,6,11-undecane triisocyanate, 1,3,6-hexamethylene triisocyanate, and bicycloheptane triisocyanate.

Examples of the hydrolyzable organosilane of Formula (1) used in the present invention include the compounds below.

Formula (III-1)
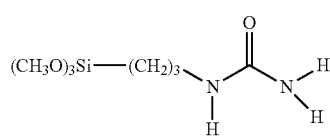

Formula (III-2)
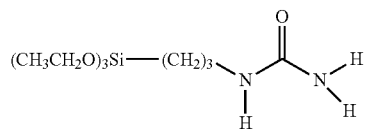

Formula (III-3)
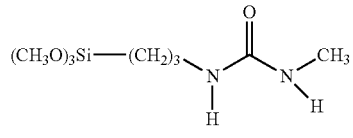

Formula (III-4)
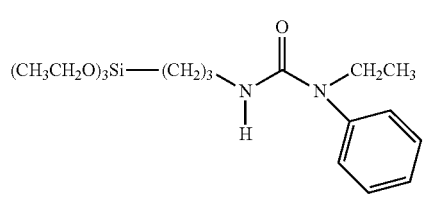

Formula (III-5)
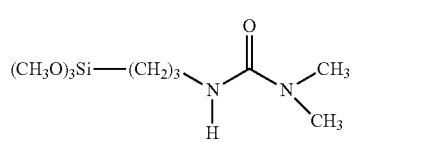

Formula (III-6)
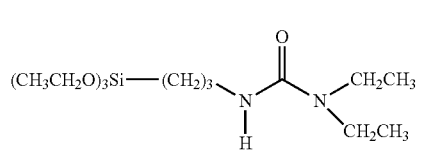

Formula (III-7)
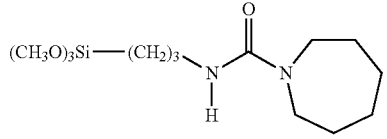

Formula (III-8)
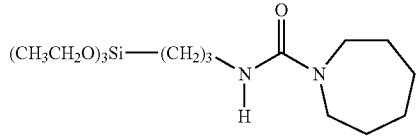

Formula (III-9)
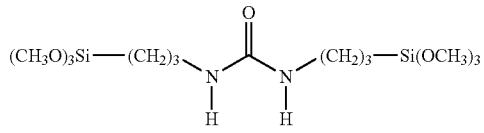

Formula (III-10)
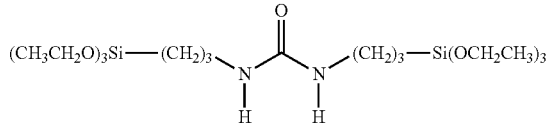

Formula (III-11)
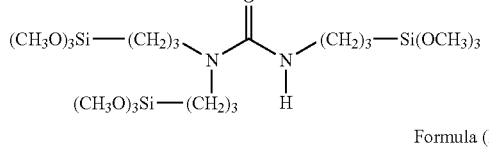

Formula (III-12)
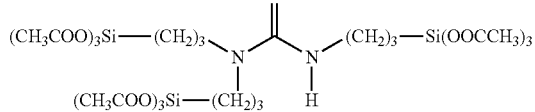

Formula (III-13)
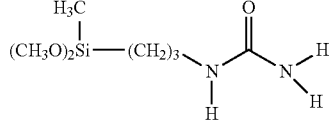

Formula (III-14)
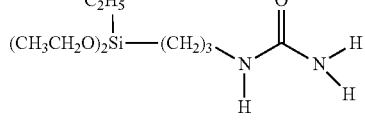

Formula (III-15)
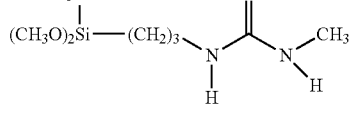

Formula (III-16)
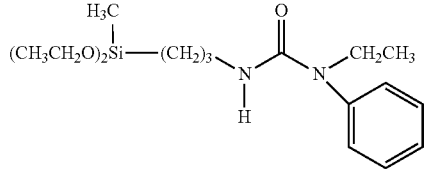

Formula (III-17)
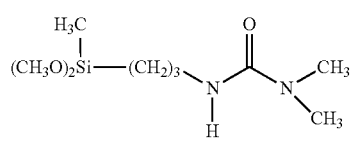
Formula (III-18)
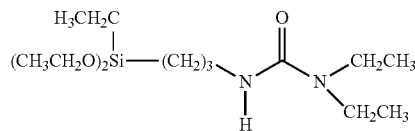
Formula (III-19)
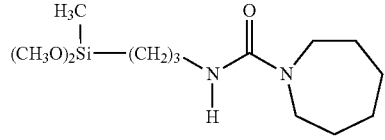
Formula (III-20)
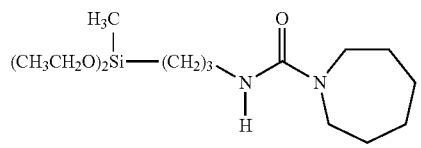
Formula (III-21)
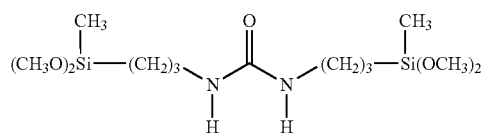
Formula (III-22)
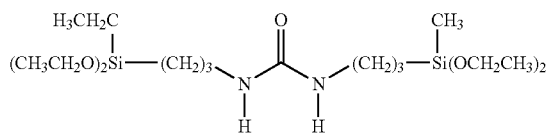
Formula (III-23)
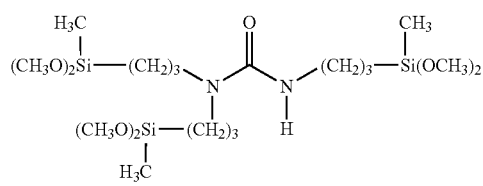
Formula (III-24)
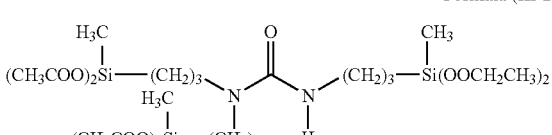
Formula (III-25)
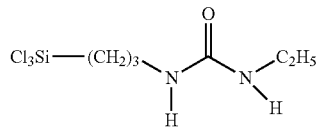
Formula (III-26)

Formula (III-27)
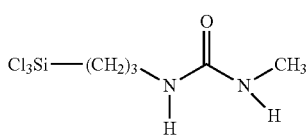
Formula (III-28)
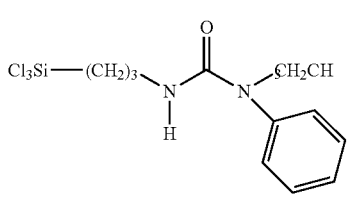
Formula (III-29)
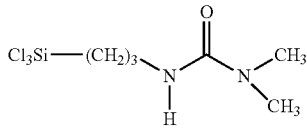
Formula (III-30)
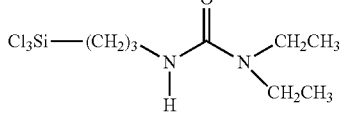
Formula (III-31)
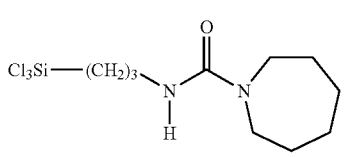
Formula (III-32)
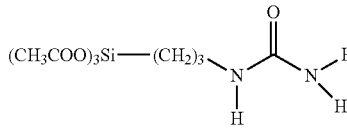
Formula (III-33)
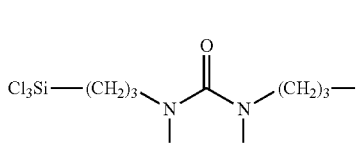
Formula (III-34)
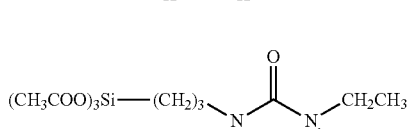
Formula (III-35)
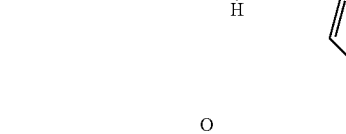
Formula (III-36)
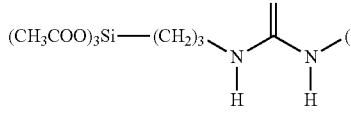

In the present invention, there can be used a combination of the hydrolyzable organosilane of Formula (1) with at least one type of organic silicon compound selected from a group consisting of Formula (4) and Formula (5), a hydrolysis product thereof, or a hydrolysis-condensation product thereof.

As the hydrolysis-condensation product thereof, there can be used: a copolymer obtained by copolymerizing the hydrolyzable organosilane of Formula (1) with at least one type of organic silicon compound selected from a group consisting of Formula (4) and Formula (5); and a mixture of a hydrolysis-condensation product of the hydrolyzable organosilane of Formula (1) with a hydrolysis-condensation product of at least one type of organic silicon compound selected from a group consisting of Formula (4) and Formula (5).

The hydrolyzable organosilane of Formula (1), a hydrolysis product thereof, or a hydrolysis-condensation product thereof and at least one type of silicon-containing compound selected from a group consisting of the organic silicon compound of Formula (4) and the organic silicon compound of Formula (5), a hydrolysis product thereof, or a hydrolysis-condensation product thereof can be used in combination thereof.

The hydrolyzable organosilane of Formula (1) and the silicon-containing compound of Formula (4) and/or Formula (5) can be used in a molar ratio in a range of 1:0 to 1:200. As the silicon-containing compound selected from a group consisting of Formula (4) and Formula (5), the silicon-containing compound of Formula (4) is preferably used.

These compounds are preferably used as a hydrolysis-condensation product of the compound (a polymer of a polyorganosiloxane), and a hydrolysis-condensation product (a polymer of a polyorganosiloxane) of the hydrolyzable organosilane of Formula (1) with the silicon-containing compound of Formula (4) is preferably used.

Examples of the alkyl group, the aryl group, the halogenated alkyl group, the halogenated aryl group, the alkenyl group, and the organic group having an epoxy group, an acryloyl group, a methacryloyl group, a mercapto group, an amino group, or a cyano group of $R^6$, $R^7$, $R^8$, and $R^9$, examples of the alkoxy group, the acyloxy group, and the halogen atom contained in the hydrolyzable group, and examples of the alkylene group and the arylene group of Y, all of which are in the silicon-containing compounds of Formula (4) and Formula (5), include the examples described with respect to Formula (2).

Examples of the silicon-containing compound of Formula (4) include tetramethoxysilane, tetrachlorosilane, tetraacetoxysilane, tetraethoxysilane, tetra-n-propoxysilane, tetraisopropoxysilane, tetra-n-butoxysilane, tetraacetoxysilane, methyltrimethoxysilane, methyltrichlorosilane, methyltriacetoxysilane, methyltripropoxysilane, methyltriacetoxysilane, methyltributoxysilane, methyltripropoxysilane, methyltriamyloxysilane, methyltriphenoxysilane, methyltribenzyloxysilane, methyltriphenethyloxysilane, glycidoxymethyltrimethoxysilane, glycidoxymethyltriethoxysilane, α-glycidoxyethyltrimethoxysilane, α-glycidoxyethyltriethoxysilane, β-glydidoxyethyltrimethoxysilane, β-glycidoxyethyltriethoxysilane, α-glycidoxypropyltrimethoxysilane, α-glycidoxypropyltriethoxysilane, β-glycidoxypropyltrimethoxysilane, β-glycidoxypropyltriethoxysilane, γ-glycidoxypropyltrimethoxysilane, γ-glycidoxypropyltriethoxysilane, γ-glycidoxypropyltripopoxysilane, γ-glycidoxypropyltributoxysilane, γ-glycidoxypropyltriphenoxysilane, α-glycidoxybutyltrimethoxysilane, α-glycidoxybutyltriethoxysilane, β-glycidoxybutyltriethoxysilane, γ-glycidoxybutyltrimethoxysilane, γ-glycidoxybutyltriethoxysilane, δ-glycidoxybutyltrimethoxysilane, δ-glycidoxybutyltriethoxysilane, (3,4-epoxycyclohexyl)methyltrimethoxysilane, (3,4-epoxycyclohexyl)methyltriethoxysilane, β-(3,4-epoxycyclohexyl)ethyltrimethoxysilane, β-(3,4-epoxycyclohexyl)ethyltriethoxysilane, β-(3,4-epoxycyclohexyl)ethyltripropoxysilane, β-(3,4-epoxycyclohexyl)ethyltributoxysilane, β-(3,4-epoxycyclohexyl)ethyltriphenoxysilane, γ-(3,4-epoxycyclohexyl)propyltrimethoxysilane, γ-(3,4-epoxycyclohexyl)propyltriethoxysilane, δ-(3,4-epoxycyclohexyl)butyltrimethoxysilane, δ-(3,4-epoxycyclohexyl)butyltriethoxysilane, glycidoxymethylmethyldimethoxysilane, glycidoxymethylmethyldiethoxysilane, α-glycidoxyethylmethyldimethoxysilane, α-glycidoxyethylmethyldiethoxysilane, β-glycidoxyethylmethyldimethoxysilane, β-glycidoxyethylethyldimethoxysilane, α-glycidoxypropylmethyldimeoxysilane, α-glycidoxypropylmethyldiethoxysilane, β-glycidoxypropylmethyldimethoxysilane, β-glycidoxypropylethyldimethoxysilane, γ-glycidoxypropylmethyldimethoxysilane, γ-glycidoxypropylmethyldiethoxysilane, γ-glycidoxypropylmethyldipropoxysilane, γ-glycidoxypropylmethyldibutoxysilane, γ-glycidoxypropylmethyldiphenoxysilane, γ-glycidoxypropylethyldimethoxysilane, γ-glycidoxypropylethyldiethoxysilane, γ-glycidoxypropylvinyldimethoxysilane, γ-glycidoxypropylvinyldiethoxysilane, ethyltrimethoxysilane, ethyltriethoxysilane, vinyltrimethoxysilane, vinyltrichlorosilane, vinyltriactoxysilane, vinyltriethoxysilane, vinyltriacetoxysilane, phenyltrimethoxysilane, phenyltrichlorosilane, phenyltriacetoxysilane, phenyltriethoxysilane, phenyltriacetoxysilane, γ-chloropropyltrimethoxysilane, γ-chloropropyltriethoxysilane, γ-chloropropyltriacetoxysilane, 3,3,3-trifluoropropyltrimethoxysilane, γ-methacryloxypropyltrimethoxysilane, γ-mercaptopropyltrimethoxysilane, γ-mercaptopropyltriethoxysilane, β-cyanoethyltriethoxysilane, chloromethyltrimethoxysilane, chloromethyltriethoxysilane, N-(β-aminoethyl)γ-aminopropyltrimethoxysilane, γ-aminopropyltrichlorosilane, γ-aminopropyltriacetoxysilane, N-(β-aminoethyl)γ-aminopropylmethyldimethoxysilane, N-((β-aminoethyl)γ-aminopropylmethyldichlorosilane, N-(β-aminoethyl)γ-aminopropylmethyldiacetoxysilane, γ-aminopropylmethyldimethoxysilane, γ-aminopropylmethyldichlorosilane, N-(β-aminoethyl)γ-aminopropyltriethoxysilane, N-(β-aminoethyl)γ-aminopropylmethyldiethoxysilane, dimethyldimethoxysilane, phenylmethyldimethoxysilane, dimethyldiethoxysilane, phenylmethyldiethoxysilane, γ-chloropropylmethyldimethoxysilane, γ-chloropropylmethyldiethoxysilane, dimethyldiacetoxysilane, γ-methacryloxypropylmethyldimethoxysilane, γ-methacryloxypropylmethyldiethoxysilane, γ-mercaptopropylmethyldimethoxysilane, γ-mercaptomethyldiethoxysilane, methylvinyldimethoxysilane, and methylvinyldiethoxysilane.

Examples of the silicon-containing compound of Formula (5) include methylenebistrimethoxysilane, methylenebistrichlorosilane, methylenebistriacetoxysilane, ethylenebistriethoxysilane, ethylenebistrichlorosilane, ethylenebistriacetoxysilane, propylenebistriethoxysilane, butylenebistrimethoxysilane, phenylenebistrimethoxysilane, phenylenebistriethoxysilane, phenylenebismethyldiethoxysilane, phenylenebismethyldimethoxysilane, naphthylenebistrimethoxysilane, bistrimethoxydisilane, bistriethoxydisilane, bisethyldiethoxydisilane, and bismethyldimethoxydisilane.

Further, specific examples of the hydrolysis-condensation product of the hydrolyzable organosilane of Formula (1) and the hydrolysis-condensation product of the hydrolyzable organosilane of Formula (1) with the silicon-containing compound of Formula (4) include the following.

Formula (IV-1)
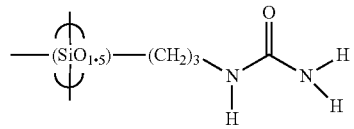

Formula (IV-2)
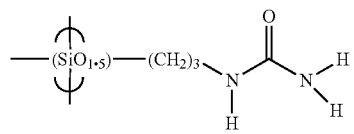

Formula (IV-3)
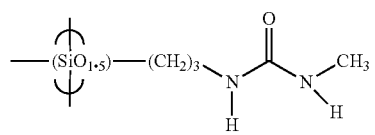

Formula (IV-4)
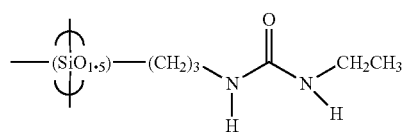

Formula (IV-5)
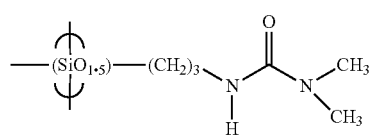

Formula (IV-6)
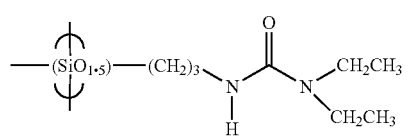

Formula (IV-7)
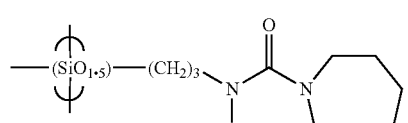

Formula (IV-8)
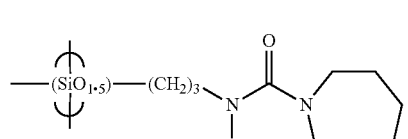

Formula (IV-9)
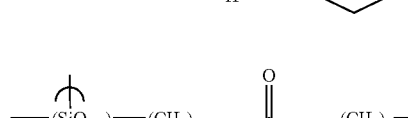

-continued

Formula (IV-10)
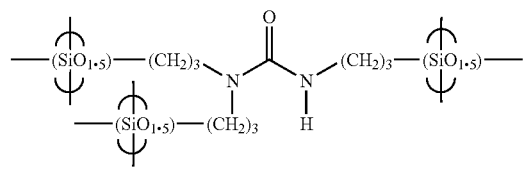

Formula (IV-11)
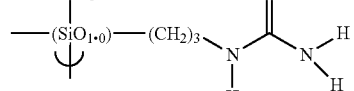

Formula (IV-12)
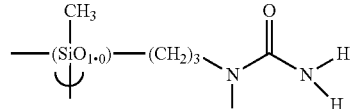

Formula (IV-13)
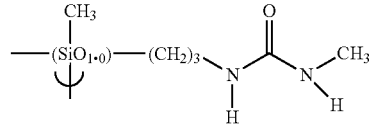

Formula (IV-14)
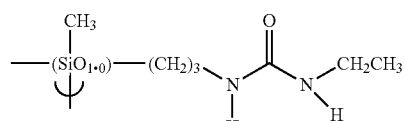

Formula (IV-15)
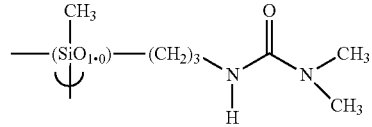

Formula (IV-16)
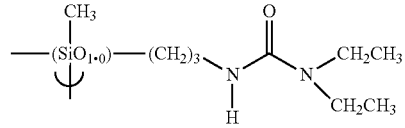

Formula (IV-17)
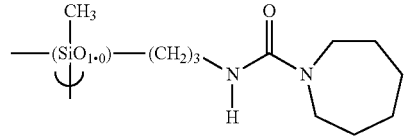

Formula (IV-18)
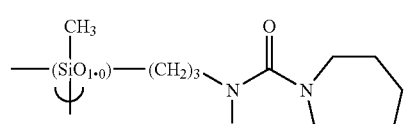

Formula (IV-19)
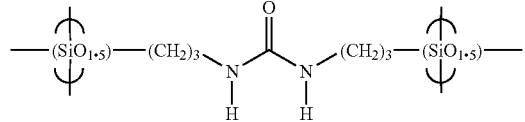

Formula (IV-20)
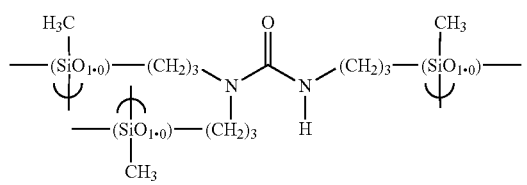

Formula (IV-21)
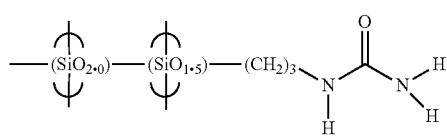

Formula (IV-22)
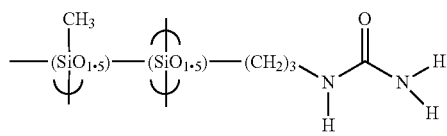

Formula (IV-23)
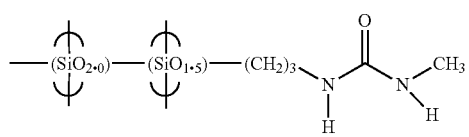

Formula (IV-24)
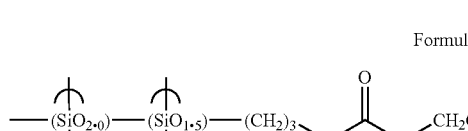

Formula (IV-25)
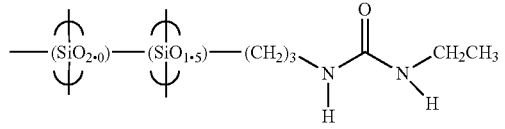

Formula (IV-26)
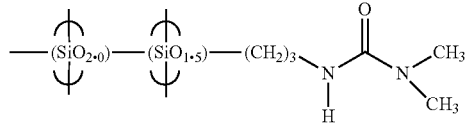

Formula (IV-27)
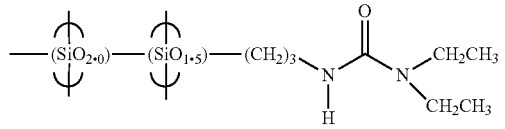

Formula (IV-28)
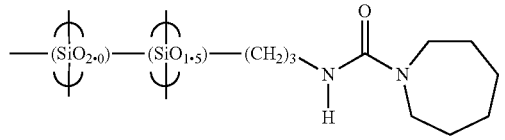

Formula (IV-29)
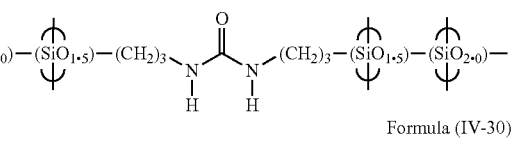

Formula (IV-30)
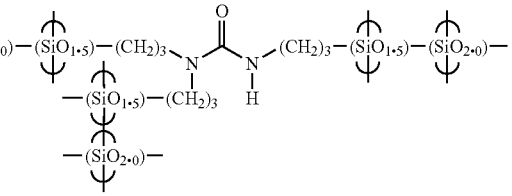

Formula (IV-31)
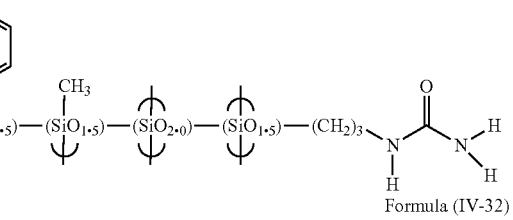

Formula (IV-32)
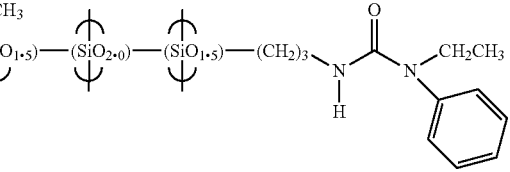

The hydrolysis-condensation product of the hydrolyzable organosilane of Formula (1) or the hydrolysis-condensation product of the hydrolyzable organosilane of Formula (1) with the organic silicon compound of Formula (4) and/or Formula (5) is a polyorganosiloxane, that is, a polymer. These condensation products can be obtained having a weight average molecular weight in a range of 1,000 to 1,000,000 or 1,000 to 100,000. This molecular weight is a molecular weight obtained by a GPC analysis and converted into that of polystyrene.

Examples of the condition for the GPC measurement include: using a GPC apparatus (trade name: HLC-8220GPC; manufactured by Tosoh Corporation); using a GPC column (trade names: Shodex KF803L, KF802, and KF801; manufactured by Showa Denko K. K.); using a column temperature of 40° C.; using tetrahydrofuran as the eluting liquid (eluting solvent); using a flow amount (flow rate) of 1.0 mL/min; and using polystyrene (manufactured by Showa Denko K. K.) as the standard sample.

For the hydrolysis of an alkoxysilyl group or an acyloxysilyl group, water is used in an amount of 0.5 to 100 mol, preferably 1 to 10 mol(s), relative to 1 mot of a hydrolyzable group.

The reaction temperature for performing the hydrolysis and the condensation is usually 20 to 80° C.

The hydrolysis may be performed either perfectly or partially. That is, in the hydrolysis-condensation product, a hydrolysis product or a monomer may remain.

During the hydrolysis and the condensation, a catalyst can be used.

Examples of the catalyst for the hydrolysis include metal chelate compounds, organic acids, inorganic acids, organic bases, and inorganic bases.

Examples of the metal chelate compounds as the catalyst for the hydrolysis include: titanium chelate compounds such as triethoxy-mono(acetylacetonate)titanium, tri-n-propoxy-mono(acetylacetonate)titanium, triisopropoxy-mono(acetylacetonate)titanium, tri-n-butoxy-mono(acetylacetonate)titanium, tri-sec-butoxy-mono(acetylacetonate)titanium, tri-tert-butoxy-mono(acetylacetonate)titanium, diethoxy-bis(acetylacetonate)titanium, di-n-propoxy-bis(acetylacetonate)titanium, diisopropoxy-bis(acetylacetonate)titanium, di-n-butoxy-bis(acetylacetonate)titanium, di-sec-butoxy-bis(acetylacetonate)titanium, di-tert-butoxy-bis(acetylacetonate)titanium, monoethoxy-tris(acetylacetonate)titanium, mono-n-propoxy-tris(acetylacetonate)titanium, monoisopropoxy-tris(acetylacetonate)titanium, mono-n-butoxy-tris(acetylacetonate)titanium, mono-sec-butoxy-tris(acetylacetonate)titanium, mono-tert-butoxy-tris(acetylacetonate)titanium, tetrakis(acetylacetonate)titanium, triethoxy-mono(ethylacetoacetate)titanium, tri-n-propoxy-mono(ethylacetoacetate)titanium, triisopropoxy-mono(ethylacetoacetate)titanium, tri-n-butoxy-mono(ethylacetoacetate)titanium, tri-sec-butoxy-mono(ethylacetoacetate)titanium, tri-tert-butoxy-mono(ethylacetoacetate)titanium, diethoxy-bis(ethylacetoacetate)titanium, di-n-propoxy-bis(ethylacetoacetate)titanium, diisopropoxy-bis(ethylacetoacetate)titanium, di-n-butoxy-bis(ethylacetoacetate)titanium, di-sec-butoxy-bis(ethylacetoacetate)titanium, di-tert-butoxy-bis(ethylacetoacetate)titanium, monoethoxy-tris(ethylacetoacetate)titanium, mono-n-propoxy-tris(ethylacetoacetate)titanium, monoisopropoxy-tris(ethylacetoacetate)titanium, mono-n-butoxy-tris(ethylacetoacetate)titanium, mono-sec-butoxy-tris(ethylacetoacetate)titanium, mono-tert-butoxy-tris(ethylacetoacetate)titanium, tetrakis(ethylacetoacetate)titanium, mono(acetylacetonate)tris(ethylacetoacetate)titanium, bis(acetylacetonate)bis(ethylacetoacetate)titanium, and tris(acetylacetonate)mono(ethylacetoacetate)titanium; zirconium chelate compounds such as triethoxy-mono(acetylacetonate)zirconium, tri-n-propoxy-mono(acetylacetonate)zirconium, triisopropoxy-mono(acetylacetonate)zirconium, tri-n-butoxy-mono(acetylacetonate)zirconium, tri-sec-butoxy-mono(acetylacetonate)zirconium, tri-tert-butoxy-mono(acetylacetonate)zirconium, diethoxy-bis(acetylacetonate)zirconium, di-n-propoxy-bis(acetylacetonate)zirconium, diisopropoxy-bis(acetylacetonate)zirconium, di-n-butoxy-bis(acetylacetonate)zirconium, di-sec-butoxy-bis(acetylacetonate)zirconium, di-tert-butoxy-bis(acetylacetonate)zirconium, monoethoxy-tris(acetylacetonate)zirconium, mono-n-propoxy-tris(acetylacetonate)zirconium, monoisopropoxy-tris(acetylacetonate)zirconium, mono-n-butoxy-tris(acetylacetonate)zirconium, mono-sec-butoxy-tris(acetylacetonate)zirconium, mono-tert-butoxy-tris(acetylacetonate)zirconium, tetrakis(acetylacetonate)zirconium, triethoxy-mono(ethylacetoacetate)zirconium, tri-n-propoxy-mono(ethylacetoacetate)zirconium, triisopropoxy-mono(ethylacetoacetate)zirconium, tri-n-butoxy-mono(ethylacetoacetate)zirconium, tri-sec-butoxy-mono(ethylacetoacetate)zirconium, tri-tert-butoxy-mono(ethylacetoacetate)zirconium, diethoxy-bis(ethylacetoacetate)zirconium, di-n-propoxy-bis(ethylacetoacetate)zirconium, diisopropoxy-bis(ethylacetoacetate)zirconium, di-n-butoxy-bis(ethylacetoacetate)zirconium, di-sec-butoxy-bis(ethylacetoacetate)zirconium, di-tert-butoxy-bis(ethylacetoacetate)zirconium, monoethoxy-tris(ethylacetoacetate)zirconium, mono-n-propoxy-tris(ethylacetoacetate)zirconium, monoisopropoxy-tris(ethylacetoacetate)zirconium, mono-n-butoxy-tris(ethylacetoacetate)zirconium, mono-sec-butoxy-tris(ethylacetoacetate)zirconium, mono-tert-butoxy-tris(ethylacetoacetate)zirconium, tetrakis(ethylacetoacetate)zirconium, mono(acetylacetonate)tris(ethylacetoacetate)zirconium, bis(acetylacetonate)bis(ethylacetoacetate)zirconium, and tris(acetylacetonate)mono(ethylacetoacetate)zirconium; and aluminum chelate compounds such as tris(acetylacetonate)aluminum and tris(ethylacetoacetate)aluminum.

Examples of the organic acids as the catalyst for the hydrolysis include acetic acid, propionic acid, butanoic acid, pentanoic acid, hexanoic acid, heptanoic acid, octanoic acid, nonanoic acid, decanoic acid, oxalic acid, maleic acid, methylmalonic acid, adipic acid, sebacic acid, gallic acid, butyric acid, mellitic acid, arachidonic acid, mikimic acid, 2-ethylhexanoic acid, oleic acid, stearic acid, linolic acid, linoleic acid, salicylic acid, benzoic acid, p-aminobenzoic acid, p-toluenesulfonic acid, benzenesulfonic acid, monochloroacetic acid, dichloroacetic acid, trichloroacetic acid, trifluoroacetic acid, formic acid, malonic acid, sulfonic acid, phthalic acid, fumaric acid, citric acid, and tartaric acid.

Examples of the inorganic acids as the catalyst for the hydrolysis include hydrochloric acid, nitric acid, sulfuric acid, hydrofluoric acid, and phosphoric acid.

Examples of the organic bases as the catalyst for the hydrolysis include pyridine, pyrrole, piperazine, pyrrolidine, piperidine, picoline, trimethylamine, triethylamine, monoethanolamine, diethanolamine, dimethylmonoethanolamine, monomethyldiethanolamine, triethanolamine, diazabicyclo octane, diazabicyclo nonane, diazabicyclo undecene, and tetramethylammoniumhydroxide. Examples of the inorganic bases include ammonia, sodium hydroxide, potassium hydroxide, barium hydroxide, and calcium hydroxide. Among these catalysts, metal chelate compounds, organic acids, and inorganic acids are preferred and these catalysts may be used individually or in combination of two or more types thereof.

Examples of the organic solvent used for the hydrolysis include: aliphatic hydrocarbon solvents such as n-pentane, isopentane, n-hexane, isohexane, n-heptane, isoheptane, 2,2,4-trimethylpentane, n-octane, isooctane, cyclohexane, and methylcyclohexane; aromatic hydrocarbon solvents such as benzene, toluene, xylene, ethylbenzene, trimethylbenzene, methylethylbenzene, n-propylbenzene, isopropylbenzene, diethylbenzene, isobutylbenzene, triethylbenzene, di-isopropylbenzene, n-amylnaphthalene, and trimethylbenzene; monoalcohol solvents such as methanol, ethanol, n-propanol, isopropanol, n-butanol, isobutanol, sec-butanol, tert-butanol, n-pentanol, isopentanol, 2-methylbutanol, sec-pentanol, tert-pentanol, 3-methoxybutanol, n-hexanol, 2-methylpentanol, sec-hexanol, 2-ethylbutanol, sec-heptanol, heptanol-3, n-octanol, 2-ethylhexanol, sec-octanol, n-nonyl alcohol, 2,6-dimethylheptanol-4, n-decanol, sec-undecyl alcohol, trimethylnonyl alcohol, sec-tetradecyl alcohol, sec-heptadecyl alcohol, phenol, cyclohexanol, methylcyclohexanol, 3,3,5-trimethylcyclohexanol, benzyl alcohol, phenylmethylcarbinol, diacetone alcohol, and cresol; polyalcohol solvents such as ethylene glycol, propylene glycol, 1,3-butylene glycol, pentanediol-2,4, 2-methylpentanediol-2,4, hexanediol-2,5, heptanediol-2,4, 2-ethylhexanediol-1,3, diethylene glycol, dipropylene glycol, triethylene glycol, tripropylene glycol, and glycerin; ketone solvents such as acetone, methyl ethyl ketone, methyl-n-propyl ketone, methyl-n-butyl ketone, diethyl ketone, methyl-isobutyl ketone, methyl-n-pentyl ketone, ethyl-n-butyl ketone, methyl-n-hexyl ketone, di-isobutyl ketone, trimethylnonanone, cyclohexanone, methylcyclohexanone, 2,4-pentanedione, acetonylacetone, diacetone alcohol, acetophenone, and fenchone; ether solvents such as ethyl ether, isopropyl ether, n-butyl ether, n-hexyl ether, 2-ethylhexyl ether, ethylene oxide, 1,2-propylene oxide, dioxolane, 4-methyldioxolane, dioxane, dimethyldioxane, ethylene glycol monomethyl ether, ethylene glycol monoethyl ether, ethylene glycol diethyl ether, ethylene glycol mono-n-butyl ether, ethylene glycol mono-n-hexyl ether, ethylene glycol monophenyl ether, ethylene glycol mono-2-ethylbutyl ether, ethylene glycol dibutyl ether, diethylene glycol monomethyl ether, diethylene glycol monoethyl ether, diethylene glycol diethyl ether, diethylene glycol mono-n-butyl ether, diethylene glycol di-n-butyl ether, diethylene glycol mono-n-hexyl ether, ethoxy triglycol, tetraethylene glycol di-n-butyl ether, propylene glycol monomethyl ether, propylene glycol monoethyl ether, propylene glycol monopropyl ether, propylene glycol monobutyl ether, dipropylene glycol monomethyl ether, dipropylene glycol monoethyl ether, dipropylene glycol monopropyl ether, dipropylene glycol monobutyl ether, tripropylene glycol monomethyl ether, tetrahydrofuran, and 2-methyltetrahydrofuran; ester solvents such as diethyl carbonate, methyl acetate, ethyl acetate, γ-butyrolactone, γ-valerolactone, n-propyl acetate, isopropyl acetate, n-butyl acetate, isobutyl acetate, sec-butyl acetate, n-pentyl acetate, sec-pentyl acetate, 3-methoxybutyl acetate, methylpentyl acetate, 2-ethylbutyl acetate, 2-ethylhexyl acetate, benzyl acetate, cyclohexyl acetate, methylcyclohexyl acetate, n-nonyl acetate, methyl acetoacetate, ethyl acetoacetate, ethyleneglycol monomethyl ether acetate, ethyleneglycol monoethyl ether acetate, diethyleneglycol monomethyl ether acetate, diethyleneglycol monoethyl ether acetate, diethyleneglycol mono-n-butyl ether acetate, propyleneglycol monomethyl ether acetate, propyleneglycol monoethyl ether acetate, propyleneglycol monopropyl ether acetate, propyleneglycol monobutyl ether acetate, dipropyleneglycol monomethyl ether acetate, dipropyleneglycol monoethyl ether acetate, glycol diacetate, methoxytriglycol acetate, ethyl propionate, n-butyl propionate, isoamyl propionate, diethyl oxalate, di-n-butyl oxalate, methyl lactate, ethyl lactate, n-butyl lactate, n-amyl lactate, diethyl malonate, dimethyl phthalate, and diethyl phthalate; nitrogen-containing solvents such as N-methylformamide, N,N-dimethylformamide, N,N-diethylformamide, acetamide, N-methylacetamide, N,N-dimethylacetamide, N-methylpropionamide, and N-methylpyrrolidone; and sulfur-containing solvents such as dimethyl sulfide, diethyl sulfide, thiophene, tetrahydrothiophene, dimethylsulfoxide, sulfolane, and 1,3-propane sultone. These solvents may be used individually or in combination of two or more types thereof.

Particularly, propylene glycol monomethyl ether, propylene glycol monoethyl ether, propylene glycol monopropyl ether, propylene glycol monobutyl ether, propylene glycol dimethyl ether, propylene glycol diethyl ether, propylene glycol monomethyl ether acetate, propylene glycol monoethyl ether acetate, and propylene glycol monopropyl ether acetate are preferred in terms of the preservation stability of the solution thereof.

The resist underlayer film forming composition of the present invention may contain a curing catalyst. The curing catalyst performs its function as a curing catalyst when the coating film containing a polyorganosiloxane composed of a hydrolysis-condensation product is heated to be cured.

As the curing catalyst, ammonium salts, phosphines, or phosphonium salts can be used.

Examples of the ammonium salt include: quaternary ammonium salts having a structure of Formula (D-1):

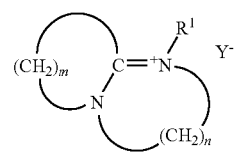

Formula (D-1)

(where m is 2 to 11; n is an integer of 2 to 3; $R^1$ is an alkyl group or an aryl group; and $Y^-$ is an anion);

quaternary ammonium salts having a structure of Formula (D-2):

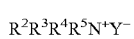

Formula (D-2)

(where $R^2$, $R^3$, $R^4$, and $R^5$ are an alkyl group or an aryl group; N is a nitrogen atom; and $Y^-$ is an anion, where $R^2$, $R^3$, $R^4$, and $R^5$ are individually bonded to a nitrogen atom through a C—N bond);

quaternary ammonium salts having a structure of Formula (D-3):

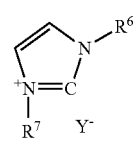

Formula (D-3)

(where $R^6$ and $R^7$ are an alkyl group or an aryl group; and $Y^-$ is an anion);

quaternary ammonium salts having a structure of Formula (D-4):

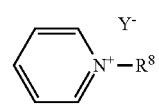

Formula (4)

(where $R^8$ is an alkyl group or an aryl group; and $Y^-$ is an anion);

quaternary ammonium salts having a structure of Formula (D-5):

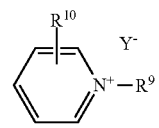

Formula (D-5)

(where $R^9$ and $R^{10}$ are an alkyl group or an aryl group; and $Y^-$ is an anion); and tertiary ammonium salts having a structure of Formula (D-6):

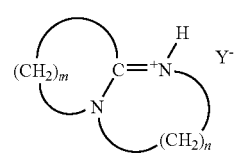

Formula (D-6)

(where m is 2 to 11; n is an integer of 2 to 3; H is a hydrogen atom; and $Y^-$ is an anion).

Examples of the phosphonium salt include quaternary phosphonium salts of Formula (D-7):

  Formula (D-7)

(where $R^{11}$, $R^{12}$, $R^{13}$, and $R^{14}$ are an alkyl group or an aryl group; P is a phosphorus atom; and $Y^-$ is an anion, where $R^{11}$, $R^{12}$, $R^{13}$, and $R^{14}$ are individually bonded to a phosphorus atom through a C—P bond).

The compound of Formula (D-1) is a quaternary ammonium salt derived from an amine, and m is an integer of 2 to 11, and n is an integer of 2 to 3. $R^1$ of the quaternary ammonium salt is a $C_{1-18}$, preferably $C_{2-10}$, alkyl group or aryl group and examples thereof include: linear alkyl groups such as an ethyl group, a propyl group, and a butyl group; a benzyl group; a cyclohexyl group; a cyclohexylmethyl group; and a dicyclopentadienyl group. Examples of the anion ($Y^-$) include halogen ions such as a chlorine ion ($Cl^-$), a bromine ion ($Br^-$), and an iodine ion ($I^-$); and acid groups such as carboxylato ($—COO^-$), sulfonato ($—SO_3^-$), and alcoholate ($—O^-$).

The compound of Formula (D-2) is a quaternary ammonium salt of $R^2R^3R^4R^5N^+Y^-$. $R^2$, $R^3$, $R^4$, and $R^5$ of the quaternary ammonium salt are a $C_{1-18}$ alkyl group or aryl group. Examples of the anion ($Y^-$) include: halogen ions such as a chlorine ion ($Cl^-$), a bromine ion ($Br^-$), and an iodine ion ($I^-$); and acid groups such as carboxylato ($—COO^-$), sulfonato ($-SO_3^-$), and alcoholate ($—O^-$). The quaternary ammonium salt is commercially available and examples thereof include tetramethylammonium acetate, tetrabutylammonium acetate, triethylbenzylammonium chloride, triethylbenzylammonium bromide, trioctylmethylammonium chloride, tributylbenzylammonium chloride, and trimethylbenzylammonium chloride.

The compound of Formula (D-3) is a quaternary ammonium salt derived from a 1-substituted imidazole, $R^6$ and $R^7$ have 1 to 18 carbon atoms and the sum of the numbers of carbon atoms of $R^6$ and $R^7$ is preferably 7 or more. Examples of $R^6$ include a methyl group, an ethyl group, a propyl group, a phenyl group, and a benzyl group, and examples of $R^7$ include a benzyl group, an octyl group, and an octadecyl group. Examples of the anion ($Y^-$) include: halogen ions such as a chlorine ion ($Cl^-$), a bromine ion ($Br^-$), and an iodine ion ($I^-$); and acid groups such as carboxylato ($—COO^-$), sulfonato ($—SO_3^-$), and alcoholate ($—O^-$). The compound either is commercially available or can be produced by, for example, reacting an imidazole-based compound such as 1-methylimidazole and 1-benzylimidazole with halogenated alkyl or halogenated aryl such as benzyl bromide and methyl bromide.

The compound of Formula (D-4) is a quaternary ammonium salt derived from pyridine, and $R^8$ is a $C_{1-18}$, preferably $C_{4-18}$, alkyl group or aryl group and examples thereof include a butyl group, an octyl group, a benzyl group, and a lauryl group. Examples of the anion ($Y^-$) include: halogen ions such as a chlorine ion ($Cl^-$), a bromine ion ($Br^-$), and an iodine ion ($I^-$); and acid groups such as carboxylato ($—COO^-$), sulfonato ($—SO_3^-$), and alcoholate ($—O^-$). The compound either is commercially available or can be produced by, for example, reacting pyridine with halogenated alkyl or halogenated aryl such as lauryl chloride, benzyl chloride, benzyl bromide, methyl bromide, and octyl bromide. Examples of the compound include N-laurylpyridinium chloride and N-benzylpyridinium bromide.

The compound of Formula (D-5) is a quaternary ammonium salt derived from a substituted pyridine such as picoline and the like, and $R^9$ is a $C_{1-18}$, preferably $C_{4-18}$, alkyl group or aryl group and examples thereof include a methyl group, an octyl group, a lauryl group, and a benzyl group. $R^{10}$ is a $C_{1-18}$ alkyl group or aryl group and when the compound is, for example, a quaternary ammonium derived from picoline, $R^{10}$ is a methyl group. Examples of the anion ($Y^-$) include: halogen ions such as a chlorine ion ($Cl^-$), a bromine ion ($Br^-$), and an iodine ion ($I^-$); and acid groups such as carboxylato ($—COO^-$), sulfonato ($—SO_3^-$), and alcoholate ($—O^-$). The compound either is commercially available or can be produced by, for example, reacting a substituted pyridine such as picoline with halogenated alkyl or halogenated aryl such as methyl bromide, octyl bromide, lauryl chloride, benzyl chloride, and benzyl bromide. Examples of the compound include N-benzylpicolinium chloride, N-benzylpicolinium bromide, and N-laurylpicolinium chloride.

The compound of Formula (D-6) is a tertiary ammonium salt derived from an amine, and m is an integer of 2 to 11 and n is an integer of 2 to 3. Examples of the anion ($Y^-$) include: halogen ions such as a chlorine ion ($Cl^-$), a bromine ion ($Br^-$), and an iodine ion ($I^-$); and acid groups such as carboxylato ($—COO^-$), sulfonato ($—SO_3^-$), and alcoholate ($—O^-$). The compound can be produced by a reaction of an amine with a weak acid such as a carboxylic acid and phenol. Examples of the carboxylic acid include formic acid and acetic acid. When formic acid is used, the anion ($Y^-$) is ($HCOO^-$) and when acetic acid is used, the anion ($Y^-$) is ($CH_3COO^-$). When phenol is used, the anion ($Y^-$) is ($C_6H_5O^-$).

The compound of Formula (D-7) is a quaternary phosphonium salt having a structure of $R^{11}R^{12}R^{13}R^{14}P^+Y^-$. $R^{11}$, $R^{12}$, $R^{13}$, and $R^{14}$ are a $C_{1-18}$ alkyl group or aryl group. However, preferably, three groups among the four substituents of $R^{11}$ to $R^{14}$ are a phenyl group or a substituted phenyl group such as a phenyl group and a tolyl group, and the remaining group is a $C_{1-18}$ alkyl group or aryl group. Examples of the anion ($Y^-$) include: halogen ions such as a chlorine ion ($Cl^-$), a bromine ion ($Br^-$), and an iodine ion ($I^-$); and acid groups such as carboxylato ($—COO^-$), sulfonato ($-S_3^-$), and alcoholate ($—O^-$). The compound is commercially available and examples of the compound include: halogenated tetraalkylphosphoniums such as a halogenated tetra-n-butylphosphonium and a halogenated tetra-n-propylphosphonium; halogenated trialkylbenzylphosphoniums such as a halogenated triethylbenzylphosphonium; halogenated triphenylmonoalkylphosphoniums such as a halogenated triphenylmethylphosphonium and a halogenated triphenylethylphosphonium; halogenated triphenylbenzylphosphoniums; halogenated tetraphenylphosphoniums; halogenated tritolylmonoarylphosphoniums; and halogenated tritolylmonoalkylphosphoniums (where, the halogen atom is a chlorine atom or a bromine atom). Particularly preferred examples of the compound include: halogenated triphenylmonoalkylphosphoniums such as a halogenated triphenylmethylphosphonium and a halogenated triphenylethylphosphonium; halogenated triphenylmonoarylphosphoniums such as a halogenated triphenylbenzylphosphonium; halogenated tritolylmonoarylphosphoniums such as a halogenated tritolylmonophenylphosphonium; and halogenated tritolylmonoalkylphosphoniums such as a halogenated tritolylmonomethylphosphonium (where, the halogen atom is a chlorine atom or a bromine atom).

Examples of the phosphines include: primary phosphines such as methylphosphine, ethylphosphine, propylphosphine, isopropylphosphine, isobutylphosphine, and phenylphosphine; secondary phosphines such as dimethylphosphine, diethylphosphine, diisopropylphosphine, diisoamylphosphine, and diphenylphosphine; and tertially phosphines such as trimethylphosphine, triethylphosphine, triphenylphosphine, methyldiphenylphosphine, and dimethylphenylphosphine.

The used amount of the curing catalyst is 0.01 to 10 parts by mass, or 0.01 to 5 parts by mass, or 0.01 to 3 parts by mass, relative to 100 parts by mass of the polyorganosiloxane.

From the hydrolysis-condensation product (polymer) obtained by hydrolyzing and condensing a hydrolyzable organosilane in a solvent using a catalyst, an alcohol as a by-product, the used hydrolyzing catalyst, and water can be simultaneously removed by distillation under reduced pressure or the like. Then, to the resist underlayer film forming composition for lithography of the present invention containing the hydrolysis-condensation product, an organic acid, water, an alcohol, or a combination thereof can be added to stabilize the composition.

Examples of the organic acid include oxalic acid, malonic acid, methylmalonic acid, succinic acid, maleic acid, malic acid, tartaric acid, phthalic acid, citric acid, glutaric acid, citric acid, lactic acid, and salicylic acid. Among them, oxalic acid and maleic acid are preferred. The amount of the organic acid to be blended in is 0.5 to 1.0 part(s) by mass, relative to 100 parts by mass of the hydrolysis-condensation product. As the water to be blended in, pure water, ultrapure water, ion-exchanged water, or the like can be used and the blended amount thereof can be 1 to 20 part(s) by mass, relative to 100 parts by mass of the resist underlayer film forming composition.

As the alcohol to be blended in, an alcohol that is easily scattered by heating after application is preferred, and examples thereof include methanol, ethanol, propanol, isopropanol, and butanol. The amount of the alcohol to be blended in can be 1 to 20 part(s) by mass, relative to 100 parts by mass of the resist underlayer film forming composition.

The underlayer film forming composition for lithography of the present invention may contain, if necessary, organic polymer compounds, photoacid generators, surfactants, and the like, besides the above components.

By using an organic polymer compound, it is possible to control the dry etching rate (a decreased amount of the film thickness per unit time), the attenuation coefficient, the refractive index, and the like of a resist underlayer film formed from the underlayer film forming composition for lithography of the present invention.

The organic polymer compound is not particularly limited and various organic polymers such as condensation-polymerized polymers and addition-polymerized polymers can be used. As the organic polymer compound, there can be used addition-polymerized polymers and condensation-polymerized polymers such as polyesters, polystyrenes, polyimides, acrylic polymers, methacrylic polymers, polyvinylethers, phenolnovolacs, naphtholnovolacs, polyethers, polyamides, and polycarbonates. Preferably used are an organic polymer having an aromatic ring structure functioning as a light absorbing moiety such as a benzene ring, a naphthalene ring, an anthracene ring, a triazine ring, a quinoline ring, and a quinoxaline ring.

Examples of such an organic polymer compound include addition-polymerized polymers containing, as a structure unit thereof, an addition-polymerizable monomer such as benzylacrylate, benzylmethacrylate, phenylacrylate, naphthylacrylate, anthrylmethacrylate, anthrylmethylmethacrylate, styrene, hydroxystyrene, benzylvinyl ether, and N-phenylmaleimide, and condensation-polymerized polymers such as phenolnovolacs and naphtholnovolacs.

When an addition-polymerized polymer is used as the organic polymer compound, the polymer compound may be either a homopolymer or a copolymer. For producing the addition-polymerized polymer, an addition-polymerizable monomer is used. Examples of such an addition-polymerizable monomer include acrylic acid, methacrylic acid, acrylic acid ester compounds, methacrylic acid ester compounds, acrylamide compounds, methacrylamide compounds, vinyl compounds, styrene compounds, maleimide compounds, maleic anhydride, and acrylonitrile.

Examples of the acrylic acid ester compound include methyl acrylate, ethyl acrylate, normal hexyl acrylate, isopropyl acrylate, cyclohexyl acrylate, benzyl acrylate, phenyl acrylate, anthrylmethyl acrylate, 2-hydroxyethyl acrylate, 3-chloro-2-hydroxypropyl acrylate, 2-hydroxypropyl acrylate, 2,2,2-trifluoroethyl acrylate, 2,2,2-trichloroethyl acrylate, 2-bromoethyl acrylate, 4-hydroxybutyl acrylate, 2-methoxyethyl acrylate, tetrahydrofurfuryl acrylate, 2-methyl-2-adamantyl acrylate, 5-acryloyloxy-6-hydroxynorbornene-2-carboxylic-6-lactone, 3-acryloxypropyltriethoxysilane, and glycidyl acrylate.

Examples of the methacrylic acid ester compound include methyl methacrylate, ethyl methacrylate, normal hexyl methacrylate, isopropyl methacrylate, cyclohexyl methacrylate, benzyl methacrylate, phenyl methacrylate, anthrylmethyl methacrylate, 2-hydroxyethyl methacrylate, 2-hydroxypropyl methacrylate, 2,2,2-trifluoroethyl methacrylate, 2,2,2-trichloroethyl methacrylate, 2-bromoethyl methacrylate, 4-hydroxybutyl methacrylate, 2-methoxyethyl methacrylate, tetrahydrofurfuryl methacrylate, 2-methyl-2-adamantyl methacrylate, 5-methacryloyloxy-6-hydroxynorbornene-2-carboxylic-6-lactone, 3-methacryloxypropyltriethoxysilane, glycidyl methacrylate, 2-phenylethyl methacrylate, hydroxyphenyl methacrylate, and bromophenyl methacrylate.

Examples of the acrylamide compound include acrylamide, N-methylacrylamide, N-ethylacrylamide, N-benzylacrylamide, N-phenylacrylamide, N,N-dimethylacrylamide, and N-anthrylacrylamide.

Examples of the methacrylamide compound include methacrylamide, N-methylmethacrylamide, N-ethylmethacrylamide, N-benzylmethacrylamide, N-phenylmethacrylamide, N,N-dimethylmethacrylamide, and N-anthrylacrylamide.

Examples of the vinyl compound include vinyl alcohol, 2-hydroxyethyl vinyl ether, methyl vinyl ether, ethyl vinyl ether, benzyl vinyl ether, vinylacetic acid, vinyltrimethoxysilane, 2-chloroethyl vinyl ether, 2-methoxyethyl vinyl ether, vinylnaphthalene, and vinylanthracene.

Examples of the styrene compound include styrene, hydroxystyrene, chlorostyrene, bromostyrene, methoxystyrene, cyanostyrene, and acetylstyrene.

Examples of the maleimide compound include maleimide, N-methylmaleimide, N-phenylmaleimide, N-cyclohexylmaleimide, N-benzylmaleimide, and N-hydroxyethylmaleimide.

When a condensation-polymerized polymer is used as the polymer, examples of such a polymer include condensation-polymerized polymers of a glycol compound and a dicarboxylic acid compound. Examples of the glycol compound include diethylene glycol, hexamethylene glycol, and butylene glycol. Examples of the dicarboxylic acid compound include succinic acid, adipic acid, terephthalic acid, and maleic anhydride. Examples of the polymer also include polyesters, polyamides, and polyimides such as polypyromellitimide, poly(p-phenyleneterephthalamide), polybutyleneterephthalate, and polyethyleneterephthalate.

When the organic polymer compound contains a hydroxyl group, the hydroxyl group can effect a crosslinking reaction with a polyorganosiloxane.

As the organic polymer compound, there can be used a polymer compound having a weight average molecular weight of, for example, 1,000 to 1,000,000, or 3,000 to 300,000, or 5,000 to 200,000, or 10,000 to 100,000.

The organic polymer compounds may be used individually or in combination of two or more types thereof.

When the organic polymer compound is used, the content thereof is 1 to 200 parts by mass, or 5 to 100 parts by mass, or 10 to 50 parts by mass, or 20 to 30 parts by mass, relative to 100 parts by mass of the hydrolysis-condensation product thereof (polyorganosiloxane).

The resist underlayer film forming composition of the present invention may contain an acid generator. Examples of the acid generator include thermoacid generators and photoacid generators.

The photoacid generator generates an acid during exposure of the resist. Therefore, the acidity of the underlayer film can be controlled. This is one method for adjusting the acidity of the underlayer film to that of the resist on the underlayer film. In addition, by adjusting the acidity of the underlayer film, the pattern shape of the resist formed on the underlayer film can be controlled.

Examples of the photoacid generator contained in the resist underlayer film forming composition of the present invention include onium salt compounds, sulfonimide compounds, and disulfonyl diazomethane compounds.

Examples of the onium salt compound include: iodonium salt compounds such as diphenyliodoniumhexafluorophosphate, diphenyliodoniumtrifluoromethanesulfonate, diphenyliodoniumnonafluoro normal butane sulfonate, diphenyliodoniumperfluoro normal octane sulfonate, diphenyliodoniumcamphorsulfonate, bis(4-tert-butylphenyl)iodoniumcamphorsulfonate, and bis(4-tert-butylphenyl)iodoniumtrifluoromethanesulfonate; and sulfonium salt compounds such as triphenylsulfoniumhexafluoroantimonate, triphenylsulfoniumnonafluoro normal butane sulfonate, triphenylsulfoniumcamphorsulfonate, and triphenylsulfoniumtrifluoromethanesulfonate.

Examples of the sulfonimide compound include N-(trifluoromethanesulfonyloxy)succinimide, N-(nonafluoro normal butane sulfonyloxy)succinimide, N-(camphorsulfonyloxy)succinimide, and N-(trifluoromethanesulfonyloxy)naphthalimide.

Examples of the disulfonyldiazomethane compound include bis(trifluoromethylsulfonyl)diazomethane, bis(cyclohexylsulfonyl)diazomethane, bis (phenylsulfonyl)diazomethane, bis(p-toluenesufonyl)diazomethane, bis(2,4-dimethylbenzenesulfonyl)diazomethane, and methyl sulfonyl-p-toluenesulfonyldiazomethane.

These photoacid generators may be used individually or in combination of two or more types thereof.

When the photoacid generator is used, the content thereof is 0.01 to 5 parts by mass, or 0.1 to 3 parts by mass, or 0.5 to 1 parks) by mass, relative to 100 parts by mass of the polymer (polyorganosiloxane).

The surfactant is effective for suppressing the formation of a pin hole, a striation, and the like when the resist underlayer film forming composition for lithography of the present invention is applied on a substrate.

Examples of the surfactant contained in the resist underlayer film forming composition of the present invention include: nonionic surfactants, for example, polyoxyethylene alkyl ethers such as polyoxyethylene lauryl ether, polyoxyethylene stearyl ether, polyoxyethylene cetyl ether, and polyoxyethylene oleyl ether, polyoxyethylene alkylallyl ethers such as polyoxyethylene octylphenol ether and polyoxyethylene nonylphenol ether, polyoxyethylene-polyoxypropylene block copolymers, sorbitan fatty acid esters such as sorbitan monolaurate, sorbitan monopalmitate, sorbitan monostearate, sorbitan monooleate, sorbitan trioleate, and sorbitan tristearate, polyoxyethylene sorbitan fatty acid esters such as polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate; fluorinated surfactants, for example, EFTOP EF301, EF303, and EF352 (trade name; manufactured by Tohkem Products Corp.), MEGAFAC F171, F173, R-08, and R-30 (trade name; manufactured by DIC Corporation), Fluorad FC430 and FC431 (trade name; manufactured by Sumitomo 3M Limited), AsahiGuard AG710 and Surflon S-382, SC101, SC102, SC103, SC104, SC105, and SC106 (trade name; manufactured by Asahi Glass Co., Ltd.); and Organosiloxane polymer KP341 (manufactured by Shin-Etsu Chemical Co., Ltd.). These surfactants may be used individually or in combination of two or more types thereof. When the surfactant is used, the content thereof is 0.0001 to 5 parts by mass, or 0.001 to 1 part(s) by mass, or 0.01 to 0.5 parts by mass, relative to 100 parts by mass of the polymer (polyorganosiloxane).

In the resist underlayer film forming composition of the present invention, a rheology controlling agent and an adhesion assistant may be blended. The rheology controlling agent is effective for enhancing the fluidity of the underlayer film forming composition. The adhesion assistant is effective for enhancing the adhesion of the underlayer film to the semiconductor substrate or the resist.

The solvent used for the resist underlayer film forming composition of the present invention is not particularly limited so long as the solvent can dissolve the above solid content. Examples of such a solvent include methyl cellosolve acetate, ethyl cellosolve acetate, propylene glycol, propylene glycol monomethyl ether, propylene glycol monobutyl ether, propylene glycol monomethyl ether acetate, propylene glycol monoethyl ether acetate, propylene glycol monopropyl ether acetate, propylene glycol monobutyl ether acetate, toluene, xylene, methyl ethyl ketone, cyclopentanone, cyclohexanone, ethyl 2-hydroxypropionate, ethyl 2-hydroxy-2-methylpropionate, ethyl ethoxyacetate, ethyl hydroxyacetate, methyl 2-hydroxy-3-methylbutanoate, methyl 3-methoxypropionate, ethyl 3-methoxypropionate, ethyl 3-ethoxypropionate, methyl 3-ethoxypropionate, methyl pyruvate, ethyl pyruvate, ethylene glycol monomethyl ether, ethylene glycol monoethyl ether, ethylene glycol monopropyl ether, ethylene glycol monobutyl ether, ethylene glycol monomethyl ether acetate, ethylene glycol monoethyl ether acetate, ethylene glycol monopropyl ether acetate, ethylene glycol monobutyl ether acetate, diethylene glycol dimethyl ether, diethylene glycol diethyl ether, diethylene glycol dipropyl ether, diethylene glycol dibutyl ether propylene glycol monomethyl ether, propylene glycol dimethyl ether, propylene glycol diethyl ether, propylene glycol dipropyl ether, propylene glycol dibutyl ether, ethyl lactate, propyl lactate, isopropyl lactate, butyl lactate, isobutyl lactate, methyl formate, ethyl formate, propyl formate, isopropyl formate, butyl formate, isobutyl formate, amyl formate, isoamyl formate, methyl acetate, ethyl acetate, amyl acetate, isoamyl acetate, hexyl acetate, methyl propionate, ethyl propionate, propyl propionate, isopropyl propionate, butyl propionate, isobutyl propionate, methyl butyrate, ethyl butyrate, propyl butyrate, isopropyl butyrate, butyl butyrate, isobutyl butyrate, ethyl hydroxyacetate, ethyl 2-hydroxy-2-methylpropionate, methyl 3-methoxy-2-methylpropionate, methyl 2-hydroxy-3-methylbutyrate, ethyl methoxyacetate, ethyl ethoxyacetate, methyl 3-methoxypropionate, ethyl 3-ethoxypropionate, ethyl 3-methoxypropionate, 3-methoxybutyl acetate, 3-methoxypropyl acetate, 3-methyl-3-methoxybutyl acetate, 3-methyl-3-methoxybutyl propionate, 3-methyl-3-methoxybutyl butyrate, methyl acetoacetate, toluene, xylene, methyl ethyl ketone, methyl propyl ketone, methyl butyl ketone, 2-heptanone, 3-heptanone, 4-heptanone, cyclohexanone, N,N-dimethylformamide, N-methylacetamide, N,N-dimethylacetamide, N-methylpyrrolidone, and γ-butyrolactone. These solvents may be used individually or in combination of two or more types thereof.

Hereinafter, the use of the resist underlayer film forming composition of the present invention is described.

The resist underlayer film forming composition of the present invention is applied on a substrate used in the production of semiconductor devices (for example, silicon wafer substrates, silicon/silicon dioxide coated substrates, silicon nitride substrates, glass substrates, ITO substrates, polyimide substrates, low dielectric constant material (low-k material) coated substrates, etc.) by an appropriate coating method such as a spinner and a coater and, then, is baked to form a resist underlayer film. The baking conditions are accordingly selected from baking temperatures of 80° C. to 250° C. and baking times of 0.3 to 60 minutes. Preferably, the baking temperature is 150° C. to 250° C. and the baking time is 0.5 to 2 minutes. Here, the formed underlayer film has a film thickness of, for example, 10 to 1,000 nm, or 20 to 500 nm, or 50 to 300 nm, or 100 to 200 nm.

Next, on the resist underlayer film, for example a photoresist layer is formed. The formation of the photoresist layer can be performed by a known method, that is, by applying a photoresist composition solution on the underlayer film and by baking the composition solution. The photoresist has a film thickness of, for example, 50 to 10,000 nm, or 100 to 2,000 nm, or 200 to 1,000 nm.

The photoresist formed on the resist underlayer film of the present invention is not particularly limited so long as the photoresist is sensitive to light used for the exposure, and both of a negative-type photoresist and a positive-type photoresist can be used. Examples of the photoresist include: a positive-type photoresist made of a novolac resin and 1,2-naphthoquinonediazide sulfonic acid ester; a chemical amplification-type photoresist made of a binder having a group elevating the alkali dissolving rate by being decomposed by an acid, and a photoacid generator; a chemical amplification-type photoresist made of a low molecule compound elevating the alkali dissolving rate of a photoresist by being decomposed by an acid, an alkali-soluble binder, and a photoacid generator; and a chemical amplification-type photoresist made of a binder having a group elevating the alkali dissolving rate by being decomposed by an acid, a low molecule compound elevating the alkali dissolving rate of a photoresist by being decomposed by an acid, and a photoacid generator. Examples of the photoresist include trade name: APEX-E manufactured by Shipley Company, L.L.C., trade name: PAR710 manufactured by Sumitomo Chemical Co., Ltd., and trade name: SEPR430 manufactured by Shin-Etsu Chemical Co., Ltd. The examples also include fluorine atom-containing polymer-based photoresists described in Proc. SPIE, Vol. 3999, 330-334 (2000), Proc. SPIE, Vol. 3999, 357-364 (2000), and Proc. SPIE, Vol. 3999, 365-374 (2000).

Next, the exposure is performed through a predetermined mask. For the exposure, a KrF excimer laser (wavelength: 248 nm), an ArF excimer laser (wavelength: 193 nm), a F2 excimer laser (wavelength: 157 nm), and the like can be used. After the exposure, if necessary, post exposure bake can also be performed. The post exposure bake is performed under conditions accordingly selected from baking temperatures of 70° C. to 150° C. and baking times of 0.3 to 10 minutes.

In the present invention, as the resist, a resist for electron beam lithography can be used instead of the photoresist. As the electron beam resist, both a positive type and a negative type can be used. Examples of the electron beam resist include: a chemical amplification-type resist made of a binder having a group changing the alkali dissolving rate by being decomposed by an acid generator and an acid; a chemical amplification-type resist made of an alkali-soluble binder and a low molecule compound changing the alkali dissolving rate of a resist by being decomposed by an acid generator and an acid; a chemical amplification-type resist made of a binder having a group changing the alkali dissolving rate by being decomposed by an acid generator and an acid, and a low molecule compound changing the alkali dissolving rate of a resist by being decomposed by an acid; a non-chemical amplification-type resist made of a binder having a group changing the alkali dissolving rate by being decomposed by an electron beam; and a non-chemical amplification-type resist made of a binder having a moiety changing the alkali dissolving rate by being broken by an electron beam. Also in the case of using the electron beam resist, a resist pattern can be formed in the same manner as in the case of using a photoresist, by using an electron beam as the radiating source.

Next, development is performed by a developer. Consequently, for example when a positive-type photoresist is used, the photoresist of an exposed part is removed to form a photoresist pattern.

Examples of the developer include alkaline aqueous solutions such as: aqueous solutions of alkali metal hydroxides such as potassium hydroxide and sodium hydroxide; aqueous solutions of quaternary ammonium hydroxides such as tetramethylammonium hydroxide, tetraethylammonium hydroxide, and choline; and aqueous solutions of amines such as ethanolamine, propylamine, and ethylenediamine. Further, in these developers, a surfactant and the like may also be blended. The conditions for the development are accordingly selected from temperatures of 5 to 50° C. and times of 10 to 600 seconds.

Then, using the thus formed pattern of the photoresist (upper layer) as a protecting film, the removal of the resist underlayer film (intermediate layer) of the present invention is performed and, next, using the film composed of the patterned photoresist and the patterned resist underlayer film (intermediate layer) of the present invention as a protecting film, the removal of the organic underlayer film (underlayer) is performed. Finally, using the patterned resist underlayer film (intermediate layer) of the present invention and the patterned organic underlayer film (underlayer) as a protecting film, the processing of the semiconductor substrate is performed.

First, the resist underlayer film (intermediate layer) of the present invention at the part where the photoresist is removed is removed by dry etching to expose the semiconductor substrate. For dry etching the resist underlayer film of the present invention, there can be used gases such as tetrafluoromethane ($CF_4$), perfluorocyclobutane($C_4F_8$), perfluoropropane ($C_3F_8$), trifluoromethane, carbon monoxide, argon, oxygen, nitrogen, sulfur hexafluoride, difluoromethane, nitrogen trifluoride and chlorine trifluoride, chlorine, and trichloroborane and dichloroborane. For dry etching the resist underlayer film, a halogen-based gas is preferably used. By dry etching with a halogen-based gas, fundamentally, a photoresist composed of organic substances is difficult to be removed. On the contrary, the resist underlayer film of the present invention containing a large amount of silicon atoms is immediately removed by a halogen-based gas. Therefore, the decrease of the film thickness of the photoresist according to dry etching of the resist underlayer film can be suppressed. As a result, the photoresist can be used as a thin film. The resist underlayer film is dry-etched preferably with a fluorine-based gas and examples of the fluorine-based gas include tetrafluoromethane ($CF_4$), perfluorocyclobutane ($C_4F_8$), perfluoropropane ($C_3F_8$), trifluoromethane, and difluoromethane ($CH_2F_2$).

Subsequently, using the film composed of the patterned photoresist and the patterned resist underlayer film of the present invention as a protecting film, the removal of the organic underlayer film is performed. The removal of the organic underlayer film (underlayer) is performed by dry etching preferably with an oxygen-based gas. This is because the resist underlayer film of the present invention containing a large amount of silicon atoms is difficult to be removed by dry etching with an oxygen-based gas.

Finally, the processing of the semiconductor substrate is performed. The processing of the semiconductor substrate is performed by dry etching preferably with a fluorine-based gas.

Examples of the fluorine-based gas include tetrafluoromethane ($CF_4$), perfluorocyclobutane ($C_4F_8$, perfluoropropane ($C_3F_8$), trifluoromethane, and difluoromethane ($CH_2F_2$).

On the resist underlayer film of the present invention, an organic bottom anti-reflective coating can be formed before the formation of the photoresist. The bottom anti-reflective coating composition used here is not particularly limited and can be optionally selected from the compositions commonly used in a conventional lithography process to be used. In addition, the formation of the bottom anti-reflective coating can be performed by a commonly used method, for example, by applying a bottom anti-reflective coating composition by a spinner or a coater and by baking the composition.

In the present invention, after forming the organic underlayer film on the substrate, the resist underlayer film of the present invention can be formed on the organic underlayer film, and, further, the resist underlayer film can be coated with the photoresist. Thus, even when the pattern width of the photoresist becomes smaller and the photoresist is coated thinly for preventing a pattern collapse, the processing of the substrate becomes possible by selecting an appropriate etching gas. For example, the resist underlayer film of the present invention can be processed by using a fluorine-based gas having an etching rate of the resist underlayer film satisfactorily higher than that of the photoresist as an etching gas, and the organic underlayer film can be processed by using an oxygen-based gas having an etching rate of the organic underlayer film satisfactorily higher than that of the resist underlayer film of the present invention as an etching gas. Further, the substrate can be processed by using a fluorine-based gas having an etching rate of the substrate satisfactorily higher than that of the organic underlayer film as an etching gas.

The substrate on which the resist underlayer film forming composition of the present invention is applied may also be a substrate having an organic or inorganic bottom anti-reflective coating formed by a CVD method on its surface, and, on the bottom anti-reflective coating, the underlayer film of the present invention can also be formed.

A resist underlayer film formed from the resist underlayer film forming composition of the present invention may absorb light used in a lithography process depending on the wavelength of the light. In such a case, the resist underlayer film can function as a bottom anti-reflective coating having the effect of preventing a reflection light on the substrate. Further, the underlayer film of the present invention can also be used as a layer for preventing an interaction between the substrate and the photoresist, a layer having a function of preventing an adverse action of a material used in the photoresist or of a substance generated during exposure of the photoresist against the substrate, a layer having a function of preventing diffusion of a substance generated in or on the substrate during heating and baking to the upper layer photoresist, a barrier layer for reducing a poisoning effect to the photoresist layer by a semiconductor substrate dielectric layer, and the like.

A resist underlayer film formed from the resist underlayer film forming composition can be applied to a substrate in which a via hole used in the dual damascene process is fowled to be used as an embedding material capable of filling the hole without a void. The resist underlayer film can also be used as a planarizing material for planarizing the surface of a semiconductor substrate having unevenness.

Hereinafter, the present invention will be more specifically described referring to Examples which should not be construed as limiting the scope of the present invention.

EXAMPLES

Synthesis Example 1

0.95 g of 1-[3-(trimethoxysilyl)propyl]urea (Formula III-1), 57.41 g of tetraethoxysilane, 23.03 g of methyltriethoxysilane, 4.27 g of phenyltrimethoxysilane, and 85.67 g of ethanol were charged into a 300 mL flask to be dissolved and the resultant mixed solution was warmed while stirring the mixed solution with a magnetic stirrer to reflux. Next, an aqueous solution in which 0.50 g of maleic acid was dissolved in 28.23 g of ion-exchanged water, was added to the mixed solution. After the reaction was effected for 120 minutes, the resultant reaction solution was cooled down to room temperature. Subsequently, 100 g of propylene glycol monomethyl ether acetate and 100 g of propylene glycol-n-monopropyl ether were added to the reaction solution, and ethanol and water as reaction by-products were distilled off under reduced pressure to produce a solution of a hydrolysis-condensation product. The weight average molecular weight Mw of the obtained polymer (Formula IV-31) was measured by GPC and found to be 3,000 in terms of polystyrene.

Synthesis Example 2

2.39 g of 1-[3-(trimethoxysilyl)propyl]urea (Formula III-1), 56.04 g of tetraethoxysilane, 23.02 g of methyltriethoxysilane, 4.27 g of phenyltrimethoxysilane, and 85.72 g of ethanol were charged into a 300 mL flask to be dissolved and the resultant mixed solution was warmed while stirring the mixed solution with a magnetic stirrer to reflux. Next, an aqueous solution in which 0.50 g of maleic acid was dissolved in 28.23 g of ion-exchanged water, was added to the mixed solution. After the reaction was effected for 120 minutes, the resultant reaction solution was cooled down to room temperature. Subsequently, 100 g of propylene glycol monomethyl ether acetate and 100 g of propylene glycol-n-monopropyl ether were added to the reaction solution, and ethanol and water as reaction by-products were distilled off under reduced pressure to produce a solution of a hydrolysis-condensation product. The weight average molecular weight Mw of the obtained polymer (Formula IV-31) was measured by GPC and found to be 3,000 in terms of polystyrene.

Synthesis Example 3

4.54 g of 1-[3-(trimethoxysilyl)propyl]urea (Formula III-1), 57.41 g of tetraethoxysilane, 21.86 g of methyltriethoxysilane, 4.05 g of phenyltrimethoxysilane, and 85.78 g of ethanol were charged into a 300 mL flask to be dissolved and the resultant mixed solution was warmed while stirring the mixed solution with a magnetic stirrer to reflux. Next, an aqueous solution in which 0.47 g of maleic acid was dissolved in 27.96 g of ion-exchanged water, was added to the mixed solution. After the reaction was effected for 120 minutes, the resultant reaction solution was cooled down to room temperature. Subsequently, 100 g of propylene glycol monomethyl ether acetate and 100 g of propylene glycol-n-monopropyl ether were added to the reaction solution, and ethanol and water as reaction by-products were distilled off under reduced pressure to produce a solution of a hydrolysis-condensation product. The weight average molecular weight Mw of the obtained polymer (Formula IV-31) was measured by GPC and found to be 3,000 in terms of polystyrene.

Synthesis Example 4

4.54 g of 1-[3-(trimethoxysilyl)propyl]urea (Formula III-1), 57.41 g of tetraethoxysilane, 21.86 g of methyltriethoxysilane, 4.05 g of phenyltrimethoxysilane, and 85.78 g of ethanol were charged into a 300 mL flask to be dissolved and the resultant mixed solution was warmed while stirring the mixed solution with a magnetic stirrer to reflux. Next, an aqueous solution in which 0.47 g of maleic acid was dissolved in 139.8 g of ion-exchanged water, was added to the mixed solution. After the reaction was effected for 120 minutes, the resultant reaction solution was cooled down to room temperature. Subsequently, 100 g of propylene glycol monomethyl ether acetate and 100 g of propylene glycol-n-monopropyl ether were added to the reaction solution, and ethanol and water as reaction by-products were distilled off under reduced pressure to produce a solution of a hydrolysis-condensation product. The weight average molecular weight Mw of the obtained polymer (Formula IV-31) was measured by GPC and found to be 3,000 in terms of polystyrene.

Synthesis Example 5

4.85 g of (S)-N-1-phenylethyl-N-triethoxysilylpropylurea (Formula III-4), 35.62 g of tetraethoxysilane, 14.07 g of methyltriethoxysilane, and 127.27 g of ethanol were charged into a 300 mL flask to be dissolved and the resultant mixed solution was warmed while stirring the mixed solution with a magnetic stirrer to reflux. Next, an aqueous solution in which 0.96 g of hydrochloric acid was dissolved in 17.29 g of ion-exchanged water, was added to the mixed solution. After the reaction was effected for 120 minutes, the resultant reaction solution was cooled down to room temperature. Subsequently, 200 g of propylene glycol monomethyl ether acetate was added to the reaction solution, and ethanol, water, and hydrochloric acid as reaction by-products were distilled off under reduced pressure to produce a solution of a hydrolysis-condensation product. The weight average molecular weight Mw of the obtained polymer (Formula IV-32) was measured by GPC and found to be 3,000 in terms of polystyrene.

Comparative Synthesis Example 1

84.63 g of tetraethoxysilane and 84.63 g of ethanol were charged into a 300 mL flask to be dissolved and the resultant mixed solution was warmed while stirring the mixed solution with a magnetic stirrer to reflux. Next, an aqueous solution in which 1.48 g of hydrochloric acid was dissolved in 29.26 g of ion-exchanged water, was added to the mixed solution. After the reaction was effected for 60 minutes, the resultant reaction solution was cooled down to room temperature. Subsequently, 200 g of propylene glycol monomethyl ether acetate was added to the reaction solution, and ethanol, water, and hydrochloric acid as reaction by-products were distilled off under reduced pressure to produce a solution of a hydrolysis-condensation product. The weight average molecular weight Mw of the obtained polymer was measured by GPC and found to be 6,200 in terms of polystyrene.

Example 1

To 5.0 g of a solution (polymer concentration: 15% by mass) containing the polymer obtained in Synthesis Example 1, 12.5 g of propylene glycol monomethyl ether acetate and 12.5 g of propylene glycol-n-monopropyl ether were added to prepare a resist underlayer film forming composition.

Example 2

To 5.0 g of a solution (polymer concentration: 15% by mass) containing the polymer obtained in Synthesis Example 2, 12.5 g of propylene glycol monomethyl ether acetate and 12.5 g of propylene glycol-n-monopropyl ether were added to prepare a resist underlayer film forming composition.

Example 3

To 5.0 g of a solution (polymer concentration: 15% by mass) containing the polymer obtained in Synthesis Example 3, 12.5 g of propylene glycol monomethyl ether acetate and 12.5 g of propylene glycol-n-monopropyl ether were added to prepare a resist underlayer film forming composition.

Example 4

To 5.0 g of a solution (polymer concentration: 15% by mass) containing the polymer obtained in Synthesis Example 4, 12.5 g of propylene glycol monomethyl ether acetate and 12.5 g of propylene glycol-n-monopropyl ether were added to prepare a resist underlayer film forming composition.

Example 5

To 5.0 g of a solution (polymer concentration: 15% by mass) containing the polymer obtained in Synthesis Example 4, 6.75 g of propylene glycol monomethyl ether acetate, 5.0 g of propylene glycol monomethyl ether, 12.5 g of propylene glycol-n-monopropyl ether, and 0.75 g of ion-exchanged water were added to prepare a resist underlayer film forming composition.

Example 6

To 5.0 g of a solution (polymer concentration: 15% by mass) containing the polymer obtained in Synthesis Example 5, 7.5 g of propylene glycol monomethyl ether acetate, 5.0 g of propylene glycol monomethyl ether, and 12.5 g of propylene glycol-n-monopropyl ether were added to prepare a resist underlayer film forming composition.

Comparative Example 1

To 2.3 g of a solution (polymer concentration: 30% by mass) containing the polymer obtained in Comparative Synthesis Example 1, 3.3 g of propylene glycol monomethyl ether acetate was added to prepare a resist underlayer film forming composition.

(Solvent Resistance Test)

The resist underlayer film forming composition was applied on a silicon wafer by a spin coating method and was baked on a hot plate at 240° C. for 1 minute to form a resist underlayer film. Subsequently, the formed resist underlayer film was immersed in propylene glycol monomethyl ether acetate used as a solvent for the over coating resist composition for 1 minute and when the change of film thickness of the resist underlayer film between before and after the immersion was 2 nm or less, the evaluation was made as "advantageous", which is marked with "A" in Table 1.

TABLE 1

| Result of solvent resistance test | |
|---|---|
| Example 1 | A |
| Example 2 | A |
| Example 3 | A |
| Example 4 | A |
| Example 5 | A |
| Example 6 | A |
| Comparative Example 1 | A |

(Optical Constants)

The resist underlayer film forming composition was applied on a silicon wafer using a spinner. The composition was heated on a hot plate at 240° C. for 1 minute to form a resist underlayer film (film thickness: 0.09 μm). Then, the refractive index (n value) and the optical absorptivity (k value; also called as the attenuation coefficient) at wavelength of 193 nm of the resist underlayer film were measured using a spectro-ellipsometer (VUV-VASE VU-302; manufactured by J. A. Woollam Corporation). The result of the measurement is shown in Table 2.

TABLE 2

| | Refractive index n and optical absorptivity k | |
|---|---|---|
| | Refractive index n (Wavelength 193 nm) | Optical absorptivity k (Wavelength 193 nm) |
| Example 1 | 1.60 | 0.10 |
| Example 2 | 1.60 | 0.10 |
| Example 3 | 1.60 | 0.11 |
| Example 4 | 1.60 | 0.11 |

TABLE 2-continued

| | Refractive index n and optical absorptivity k | |
|---|---|---|
| | Refractive index n (Wavelength 193 nm) | Optical absorptivity k (Wavelength 193 nm) |
| Example 5 | 1.60 | 0.11 |
| Example 6 | 1.50 | 0.01 |
| Comparative Example 1 | 1.48 | 0.00 |

(Measurement of Dry Etching Rate)

Etchers and etching gases used in the measurement of dry etching rates are as follows.

Etching was performed using an etcher ES401 (trade name; manufactured by Nippon Scientific Co., Ltd) and an etching gas of $CF_4$.

Etching was performed using an etcher RIE-10NR (trade name; manufactured by Samco, Inc.) and an etching gas of $O_2$.

The solutions of resist underlayer film forming compositions prepared in Examples 1 to 6 and Comparative Example 1 were applied on a silicon wafer using a spinner. The composition solution was heated on a hot plate at 240° C. for 1 minute to form a resist underlayer film and, using each of the etching gases, the etching rate of the composition was measured. For a resist underlayer film having a film thickness of 0.20 μm, $CF_4$ gas was used as the etching gas to measure the etching rate. For a resist underlayer film having a film thickness of 0.08 μm, $O_2$ gas was used as an etching gas to measure the etching rate.

In the same manner, a photoresist solution (trade name: UV 113; manufactured by Shipley Company, L.L.C.) was applied on a silicon wafer using a spinner to form each of a resist film of 0.20 μm and a resist film of 0.08 μm. $CF_4$ gas and $O_2$ gas were used as etching gases to measure the dry etching rate. Then, the dry etching rates of the resist underlayer film and those of the resist film were compared with each other. The result is shown in Table 3. The rate ratio is a dry etching rate ratio of (resist underlayer film)/(resist).

TABLE 3

| | Dry etching rate ratio | |
|---|---|---|
| | $CF_4$ gas | $O_2$ gas |
| Example 1 | 1.9 | 0.02 |
| Example 2 | 2.0 | 0.03 |
| Example 3 | 2.1 | 0.02 |
| Example 4 | 2.0 | 0.02 |
| Example 5 | 2.0 | 0.02 |
| Example 6 | 2.0 | 0.02 |
| Comparative Example 1 | 1.3 | 0.01 |

The resist underlayer film obtained from the resist underlayer film forming composition of the present invention has a satisfactorily high dry etching rate in comparison with that of the photoresist film.

(Lithography Characteristic)

<Evaluation of Resist Patterning>

30 g of 2-vinylnaphthalene, 3.5 g of glycidyl methacrylate, and 4.5 g of 1-butoxyethyl methacrylate were dissolved in 112 g of cyclohexanone, and the inside of the flask was nitrogen-purged and was heated to 60° C. After the heating, to the resultant reaction solution, 1.9 g of azobisisobutyronitrile dissolved in 48 g of cyclohexanone was added under a pressure pressurized with nitrogen and the reaction was effected at 60° C. for 24 hours. The reaction solution was cooled down and was introduced into methanol to re-precipitate a polymer and the polymer was heated and dried to produce a polymer of Formula (V-1). The molecular weight of the obtained polymer was measured by GPC and found to be 12,000 in the weight average molecular weight Mw in terms of polystyrene. In Formula (V-1), when a repeating unit containing 2-vinylnaphthalene is assumed to be a, a repeating unit containing glycidyl methacrylate is assumed to be b, and a repeating unit containing 1-butoxy-ethyl methacrylate is assumed to be c, the molar ratio of a:b:c was 0.8:0.1:0.1.

Formula (V-1)

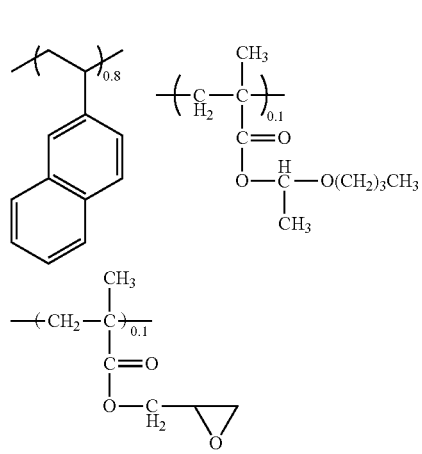

5 g of the obtained polymer (V-1) was mixed with 0.03 g of a surfactant (trade name: MEGAFAC R-30; manufactured by DIC Corporation) and the resultant mixture was dissolved in 23 g of cyclohexanone and 23 g of propylene glycol monomethyl ether to prepare a solution. Subsequently, the solution was filtered using a polyethylene microfilter having a pore diameter of 0.10 μm and was further filtered using a polyethylene microfilter having a pore diameter of 0.05 μm to prepare a resist underlayer film forming composition to be used in a lithography process. A resist underlayer film (assumed as a layer A) containing no silicon resin formed from the composition was combined with a resist underlayer film containing the urea group-containing and silicon-containing polymer of the present specification (assumed as a layer B) to constitute a multi-layer film.

A resist underlayer film forming composition containing a polymer of Formula (V-1) was applied on a silicon wafer and the composition was heated on a hot plate at 240° C. for 1 minute to form a resist underlayer film (layer A) having a film thickness of 250 nm. On the resist underlayer film (layer A), each of the resist underlayer film compositions of Example 1 to Example 6 was applied by a spin coating method and the composition was heated on a hot plate at 240° C. for 1 minute to form a resist underlayer film (layer B) having a film thickness of 80 nm. On the resist underlayer film (layer B), a commercially available photoresist solution (trade name: PAR 855; manufactured by Sumitomo Chemical Co., Ltd.) was applied by a spinner and the solution was heated on a hot plate at 100° C. for 1 minute to form a photoresist film (layer C) having a film thickness of 150 nm.

The patterning of the resist was performed using a scanner (PAS 5500/1100; manufactured by ASML Holding N.V.; wavelength: 193 nm, NA, σ: 0.75, 0.89/0.59 (Dipole)). The target was a resist pattern after the development having a line width and a width between lines both of 0.08 μm, which is a so-called line and space (dense line) pattern and the exposure was performed through a photomask set so that 9 lines were to be formed. Subsequently, the resist pattern was heated on a hot plate at 105° C. for 1 minute, was cooled down, and was developed in a 60 second single paddle-type process according to the industrial standards using a developer (2.38% by mass tetramethylammonium hydroxide aqueous solution).

The obtained positive-type resist pattern was observed and was confirmed to be a pattern in substantially perpendicular shape.

TABLE 4

| | Pattern shape |
|---|---|
| Example 1 | Perpendicular shape |
| Example 2 | Perpendicular shape |
| Example 3 | Perpendicular shape |
| Example 4 | Perpendicular shape |
| Example 5 | Perpendicular shape |
| Example 6 | Perpendicular shape |

INDUSTRIAL APPLICABILITY

The resist underlayer film obtained from the resist underlayer film forming composition of the present invention has a high dry etching rate. Accordingly, even when the resist film thickness is made thin in order to prevent pattern collapse associated with the miniaturization of pattern sizes, the resist pattern can be transferred to an underlayer because the resist underlayer film has a sufficiently high etching rate.

The invention claimed is:
1. A resist underlayer film forming composition for lithography comprising:
(i) a composition of a hydrolysis product of the hydrolyzable organosilane of Formula (1) and at least one organic silicon compound selected from the group consisting of the organic silicon compound of Formula (4) and the organic silicon compound of Formula (5), and
(ii) a solvent,
wherein a solid content of the composition is 0.5% by mass to 50% by mass, and
wherein the hydrolyzable organosilane of Formula (1) is:

Formula (1)

where:
at least one of $T^1$, $T^2$, and $T^3$ is a group of Formula (2):

Formula (2)

where:
$R^3$ is an alkylene group, an arylene group, a halogenated alkylene group, a halogenated arylene group, an alkenylene group, or a divalent linking group derived from an organic group having an epoxy group, an acryloyl group, a methacryloyl group, a mercapto group, an amino group, or a cyano group, n is 0 or 1, $R^4$ is an alkyl group, an aryl group, a halogenated alkyl group, a halogenated aryl group, an alkenyl group, or an organic group having an epoxy group, an acryloyl group, a methacryloyl group, a mercapto group, an amino group, or a cyano group, $R^5$ is an alkoxy group, an acyloxy group, or a halogen atom, and m is an integer of 0 or 1, the others of $T^1$, $T^2$, and $T^3$ that are not a group of Formula (2) are independently a hydrogen atom, $R^1$, or $R^2$, where $R^1$ and $R^2$ are independently an alkyl group, an aryl group, a halogenated alkyl group, a halogenated aryl group, an alkenyl group, or an organic group having an epoxy group, an acryloyl group, a methacryloyl group, a mercapto group, an amino group, or a cyano group, where $R^1$ and $R^2$ together optionally form a ring;

the organic silicon compound of Formula (4) is:

$$R^6{}_a Si(R^7)_{4-a} \quad \text{Formula (4)}$$

where $R^6$ is an alkyl group, an aryl group, a halogenated alkyl group, a halogenated aryl group, an alkenyl group, or an organic group having an epoxy group, an acryloyl group, a methacryloyl group, a mercapto group, an amino group, or a cyano group, and is bonded to a silicon atom through a Si—C bond, $R^7$ is an alkoxy group, an acyloxy group, or a halogen atom, and a is an integer of 0 to 3; and the organic silicon compound of Formula (5) is:

$$[R^8{}_c Si(R^9)_{3-c}]_2 Y_b \quad \text{Formula (5)}$$

where $R^8$ is an alkyl group, $R^9$ is an alkoxy group, an acyloxy group, or a halogen atom, Y is an alkylene group or an arylene group, b is an integer of 0 or 1, and c is an integer of 0 or 1; and wherein in the at least one organic silicon compound selected from the group consisting of an organic silicon compound of Formula (4) and an organic silicon compound of Formula (5), phenyltrimethoxysilane or phenyltriethoxysilane is included.

2. The resist underlayer film forming composition according to claim 1, wherein the hydrolyzable organosilane of Formula (1) is a compound obtained by reacting an isocyanate compound of Formula (3):

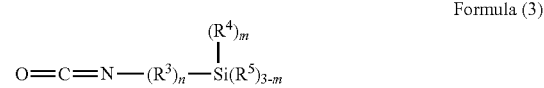

Formula (3)

$$O=C=N-(R^3)_n-\overset{(R^4)_m}{\underset{|}{Si}}(R^5)_{3-m}$$

where $R^3$, $R^4$, $R^5$, n, and m are the same as those defined in Formula (2) with ammonia, a primary amine, or a secondary amine.

3. The resist underlayer film forming composition according to claim 1, wherein the hydrolyzable organosilane of Formula (1) is a compound obtained by reacting a hydrolyzable organosilane containing an amino group or an imino group with an isocyanate compound.

4. The resist underlayer film forming composition for lithography according to claim 1, comprising:

a polymer of the hydrolysis-condensation product of a hydrolyzable organosilane of Formula (1), and a polymer of the hydrolysis-condensation product of an organic silicon compound of Formula (4).

5. The resist underlayer film forming composition according to claim 1, further comprising a curing catalyst.

6. A resist underlayer film obtained by applying the resist underlayer film forming composition as claimed in claim 1 on a semiconductor substrate and baking the composition.

7. The resist underlayer film forming composition according to claim 1, wherein the composition (i) further comprises one or more selected from the group consisting of (a) the hydrolyzable organosilane of Formula (1) and at least one organic silicon compound selected from the group consisting of the organic silicon compound of Formula (4) and the organic silicon compound of Formula (5), and (b) a hydrolysis-condensation product of the hydrolyzable organosilane of Formula (1) and at least one organic silicon compound selected from the group consisting of the organic silicon compound of Formula (4) and the organic silicon compound of Formula (5).

8. A production method of a semiconductor device comprising:

applying a resist underlayer film forming composition on a semiconductor substrate and baking the composition to form a resist underlayer film;

applying a composition for a resist on the resist underlayer film to form a resist film;

exposing the resist film to light;

developing the resist after the exposure to produce a resist pattern;

etching the resist underlayer film through the resist pattern; and processing the semiconductor substrate using the patterned resist and the patterned resist underlayer film, wherein the resist underlayer film forming composition comprises:

(i) a composition selected from the group consisting of (a) a hydrolyzable organosilane of Formula (1) and at least one organic silicon compound selected from the group consisting of an organic silicon compound of Formula (4) and an organic silicon compound of Formula (5), (b) a hydrolysis product of the hydrolyzable organosilane of Formula (1) and at least one organic silicon compound selected from the group consisting of the organic silicon compound of Formula (4) and the organic silicon compound of Formula (5), (c) a hydrolysis-condensation product of the hydrolyzable organosilane of Formula (1) and at least one organic silicon compound selected from the group consisting of the organic silicon compound of Formula (4) and the organic silicon compound of Formula (5), and (d) combinations thereof, and (ii) a solvent, wherein a solid content of the composition is 0.5% by mass to 50% by mass, and wherein the hydrolyzable organosilane of Formula (1) is:

Formula (1)

where:

at least one of $T^1$, $T^2$, and $T^3$ is a group of Formula (2):

Formula (2)

$$-(R^3)_n-\overset{(R^4)_m}{\underset{|}{Si}}(R^5)_{3-m}$$

where:
- $R^3$ is an alkylene group, an arylene group, a halogenated alkylene group, a halogenated arylene group, an alkenylene group, or a divalent linking group derived from an organic group having an epoxy group, an acryloyl group, a methacryloyl group, a mercapto group, an amino group, or a cyano group,
- n is 0 or 1,
- $R^4$ is an alkyl group, an aryl group, a halogenated alkyl group, a halogenated aryl group, an alkenyl group, or an organic group having an epoxy group, an acryloyl group, a methacryloyl group, a mercapto group, an amino group, or a cyano group,
- $R^5$ is an alkoxy group, an acyloxy group, or a halogen atom, and
- m is an integer of 0 or 1, the others of $T^1$, $T^2$, and $T^3$ that are not a group of Formula (2) are independently a hydrogen atom, $R^1$, or $R^2$, where $R^1$ and $R^2$ are independently an alkyl group, an aryl group, a halogenated alkyl group, a halogenated aryl group, an alkenyl group, or an organic group having an epoxy group, an acryloyl group, a methacryloyl group, a mercapto group, an amino group, or a cyano group, where $R^1$ and $R^2$ together optionally form a ring;

the organic silicon compound of Formula (4) is:

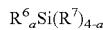

$$R^6{}_a Si(R^7)_{4-a} \quad \text{Formula (4)}$$

where
- $R^6$ is an alkyl group, an aryl group, a halogenated alkyl group, a halogenated aryl group, an alkenyl group, or an organic group having an epoxy group, an acryloyl group, a methacryloyl group, a mercapto group, an amino group, or a cyano group, and is bonded to a silicon atom through a Si—C bond,
- $R^7$ is an alkoxy group, an acyloxy group, or a halogen atom, and
- a is an integer of 0 to 3; and the organic silicon compound of Formula (5) is:

$$[R^8{}_c Si(R^9)_{3-c}]_2 Y_b \quad \text{Formula (5)}$$

where
- $R^8$ is an alkyl group,
- $R^9$ is an alkoxy group, an acyloxy group, or a halogen atom,
- Y is an alkylene group or an arylene group,
- b is an integer of 0 or 1, and
- c is an integer of 0 or 1; and wherein in the at least one organic silicon compound selected from the group consisting of an organic silicon compound of Formula (4) and an organic silicon compound of Formula (5), phenyltrimethoxysilane or phenyltriethoxysilane is included.

9. A production method of a semiconductor device comprising:
- forming an organic film on a semiconductor substrate;
- applying a resist underlayer film forming composition on the organic film and baking the composition to form a resist underlayer film;
- applying a composition for a resist on the resist underlayer film to form a resist film;
- exposing the resist film to light;
- developing the resist after the exposure to produce a resist pattern;
- etching the resist underlayer film through the resist pattern;
- etching the organic underlayer film using the patterned resist underlayer film; and
- processing the semiconductor substrate using the patterned organic underlayer film, wherein the resist underlayer film forming composition comprises:
(i) a composition selected from the group consisting of (a) a hydrolyzable organosilane of Formula (1) and at least one organic silicon compound selected from the group consisting of an organic silicon compound of Formula (4) and an organic silicon compound of Formula (5), (b) a hydrolysis product of the hydrolyzable organosilane of Formula (1) and at least one organic silicon compound selected from the group consisting of the organic silicon compound of Formula (4) and the organic silicon compound of Formula (5), (c) a hydrolysis-condensation product of the hydrolyzable organosilane of Formula (1) and at least one organic silicon compound selected from the group consisting of the organic silicon compound of Formula (4) and the organic silicon compound of Formula (5), and (d) combinations thereof, and
(ii) a solvent, wherein a solid content of the composition is 0.5% by mass to 50% by mass, and wherein the hydrolyzable organosilane of Formula (1) is:

Formula (1)

where:
at least one of $T^1$, $T^2$, and $T^3$ is a group of Formula (2):

Formula (2)

where:
- $R^3$ is an alkylene group, an arylene group, a halogenated alkylene group, a halogenated arylene group, an alkenylene group, or a divalent linking group derived from an organic group having an epoxy group, an acryloyl group, a methacryloyl group, a mercapto group, an amino group, or a cyano group,
- n is 0 or 1,
- $R^4$ is an alkyl group, an aryl group, a halogenated alkyl group, a halogenated aryl group, an alkenyl group, or an organic group having an epoxy group, an acryloyl group, a methacryloyl group, a mercapto group, an amino group, or a cyano group,
- $R^5$ is an alkoxy group, an acyloxy group, or a halogen atom, and
- m is an integer of 0 or 1, the others of $T^1$, $T^2$, and $T^3$ that are not a group of Formula (2) are independently a hydrogen atom, $R^1$, or $R^2$, where $R^1$ and $R^2$ are independently an alkyl group, an aryl group, a halogenated alkyl group, a halogenated aryl group, an alkenyl group, or an organic group having an epoxy group, an acryloyl group, a methacryloyl group, a mercapto group, an amino group, or a cyano group, where $R^1$ and $R^2$ together optionally form a ring;

the organic silicon compound of Formula (4) is:

$$R^6_a Si(R^7)_{4-a} \qquad \text{Formula (4)}$$

where
- $R^6$ is an alkyl group, an aryl group, a halogenated alkyl group, a halogenated aryl group, an alkenyl group, or an organic group having an epoxy group, an acryloyl group, a methacryloyl group, a mercapto group, an amino group, or a cyano group, and is bonded to a silicon atom through a Si—C bond,
- $R^7$ is an alkoxy group, an acyloxy group, or a halogen atom, and
- a is an integer of 0 to 3; and the organic silicon compound of Formula (5) is:

$$[R^8_c Si(R^9)_{3-c}]_2 Y_b \qquad \text{Formula (5)}$$

where
- $R^8$ is an alkyl group,
- $R^9$ is an alkoxy group, an acyloxy group, or a halogen atom,
- Y is an alkylene group or an arylene group,
- b is an integer of 0 or 1, and
- c is an integer of 0 or 1; and wherein in the at least one organic silicon compound selected from the group consisting of an organic silicon compound of Formula (4) and an organic silicon compound of Formula (5), phenyltrimethoxysilane or phenyltriethoxysilane is included.

\* \* \* \* \*